United States Patent
Takahashi et al.

(10) Patent No.: US 11,043,537 B2
(45) Date of Patent: Jun. 22, 2021

(54) THREE-DIMENSIONAL PHASE CHANGE MEMORY DEVICE INCLUDING VERTICALLY CONSTRICTED CURRENT PATHS AND METHODS OF MANUFACTURING THE SAME

(71) Applicant: WESTERN DIGITAL TECHNOLOGIES, INC., San Jose, CA (US)

(72) Inventors: Yuji Takahashi, San Jose, CA (US); Masatoshi Nishikawa, Nagoya (JP); Wei Kuo Shih, Cupertino, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/440,250

(22) Filed: Jun. 13, 2019

(65) Prior Publication Data

US 2020/0395407 A1 Dec. 17, 2020

(51) Int. Cl.
*H01L 27/24* (2006.01)
*H01L 45/00* (2006.01)

(52) U.S. Cl.
CPC ........ *H01L 27/249* (2013.01); *H01L 27/2427* (2013.01); *H01L 45/06* (2013.01); *H01L 45/1683* (2013.01)

(58) Field of Classification Search
CPC ................ H01L 45/06–065; H01L 27/24–249
USPC .......................................................... 257/5
See application file for complete search history.

(56) References Cited

U.S. PATENT DOCUMENTS

| | | |
|---|---|---|
| 9,230,974 B1 | 1/2016 | Pachamuthu et al. |
| 9,252,151 B2 | 2/2016 | Chien et al. |
| 9,356,031 B2 | 5/2016 | Lee et al. |
| 9,397,093 B2 | 7/2016 | Makala et al. |
| 9,449,981 B2 | 9/2016 | Pachamuthu et al. |

(Continued)

FOREIGN PATENT DOCUMENTS

| | | |
|---|---|---|
| KR | 1020110072025 A | 6/2011 |
| KR | 1020180068527 A | 6/2018 |

OTHER PUBLICATIONS

Notification of Transmittal of the International Search Report and Written Opinion of the International Search Authority or International Patent Application No. PCT/US2020/021868, dated Jun. 24, 2020, 11 pages.

(Continued)

*Primary Examiner* — Walter H Swanson
(74) *Attorney, Agent, or Firm* — The Marbury Law Group PLLC

(57) ABSTRACT

An alternating stack of insulating layers and sacrificial material layers is formed over a substrate. Memory openings are formed through the alternating stack. Protruding tip portions are formed on each of the sacrificial material layers around the memory openings. A plurality of insulating spacers is formed within each memory opening between each vertically neighboring pair of tip portions of the sacrificial material layers. A phase change memory material and a vertical bit line are formed within each of the memory openings. The phase change memory material can be formed as a vertical stack of discrete annular phase change memory material portions, or can be formed as a continuous phase change memory material layer. Each of the sacrificial material layer can be replaced by an electrically conductive layer.

5 Claims, 31 Drawing Sheets

(56) References Cited

U.S. PATENT DOCUMENTS

| | | |
|---|---|---|
| 9,576,975 B2 | 2/2017 | Zhang et al. |
| 9,620,712 B2 | 4/2017 | Hayashi et al. |
| 9,646,988 B2 | 5/2017 | Murakami et al. |
| 9,666,799 B2 | 5/2017 | Yanagida et al. |
| 10,050,194 B1 | 8/2018 | Nardi et al. |
| 10,115,897 B1 | 10/2018 | Sato |
| 10,249,683 B1 | 4/2019 | Lille et al. |
| 2010/0207195 A1 | 8/2010 | Fukuzumi et al. |
| 2012/0261722 A1 | 10/2012 | Tang et al. |
| 2016/0149126 A1 | 5/2016 | Pio |
| 2016/0196879 A1 | 7/2016 | Helm et al. |
| 2016/0365351 A1 | 12/2016 | Nishikawa et al. |
| 2017/0025421 A1 | 1/2017 | Sakakibara et al. |
| 2017/0194346 A1 | 7/2017 | Lee et al. |
| 2017/0271261 A1 | 9/2017 | Tsutsumi et al. |
| 2018/0122904 A1 | 5/2018 | Matsumoto et al. |

OTHER PUBLICATIONS

A. Pirovano et al., "Scaling Analysis of Phase-Change Memory Technology", IEDM Technical Digest, 29.6.1 (2003) 4 pages.

U.S. Appl. No. 16/002,243, filed Jun. 7, 2018, Sandisk Technologies LLC.

U.S. Appl. No. 16/002,169, filed Jun. 7, 2018, Sandisk Technologies LLC.

U.S. Appl. No. 15/844,005, filed Dec. 15, 2017, Sandisk Technologies LLC.

U.S. Appl. No. 16/440,378, filed Jun. 19, 2019, Sandisk Technologies LLC.

USPTO Office Communication, Notice of Allowance and Fee(s) Due for U.S. Appl. No. 16/440,378, dated Nov. 30, 2020, 18 pages.

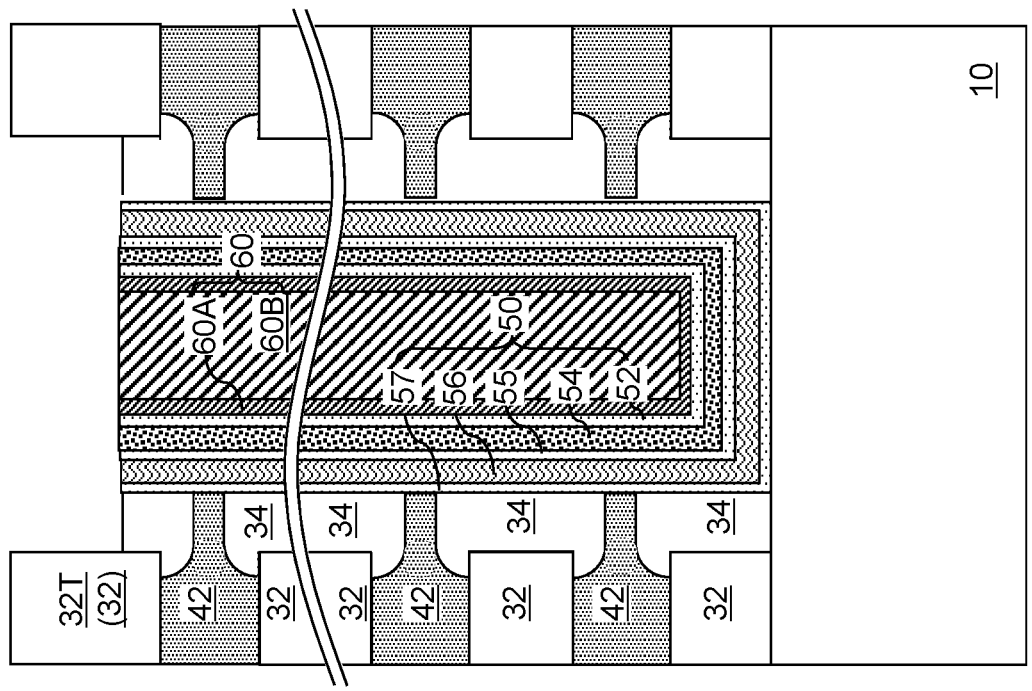
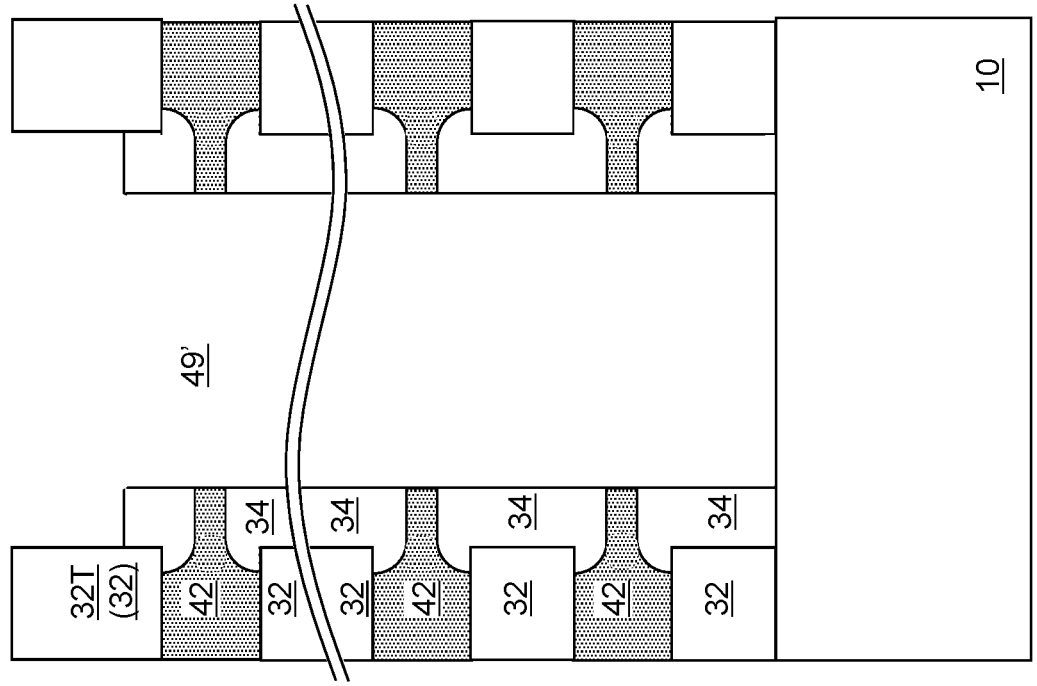
FIG. 5F
FIG. 5E

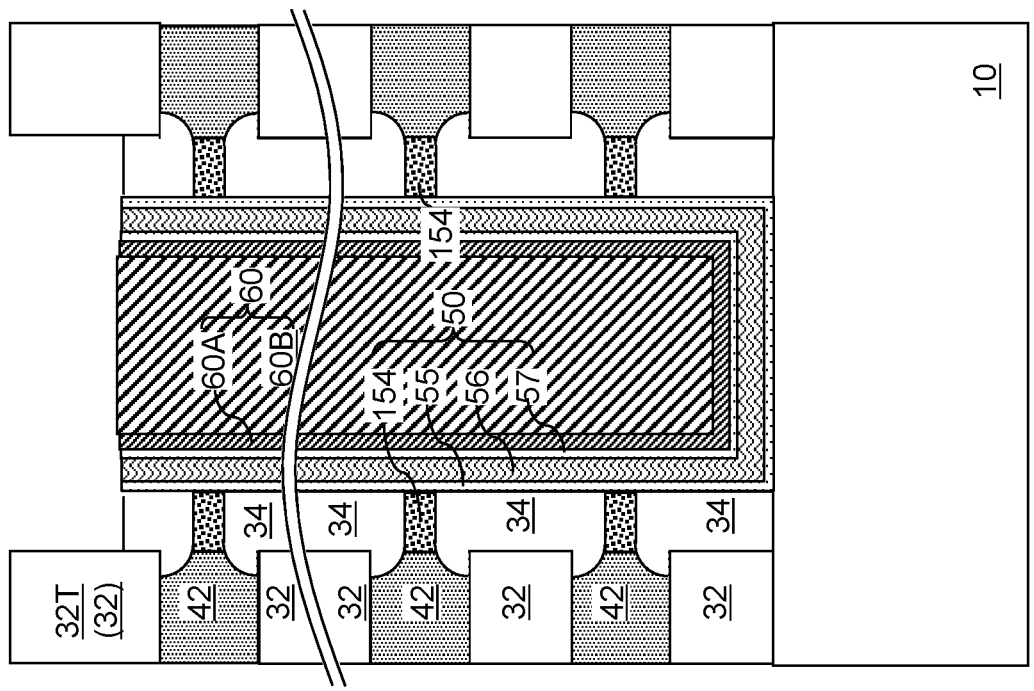
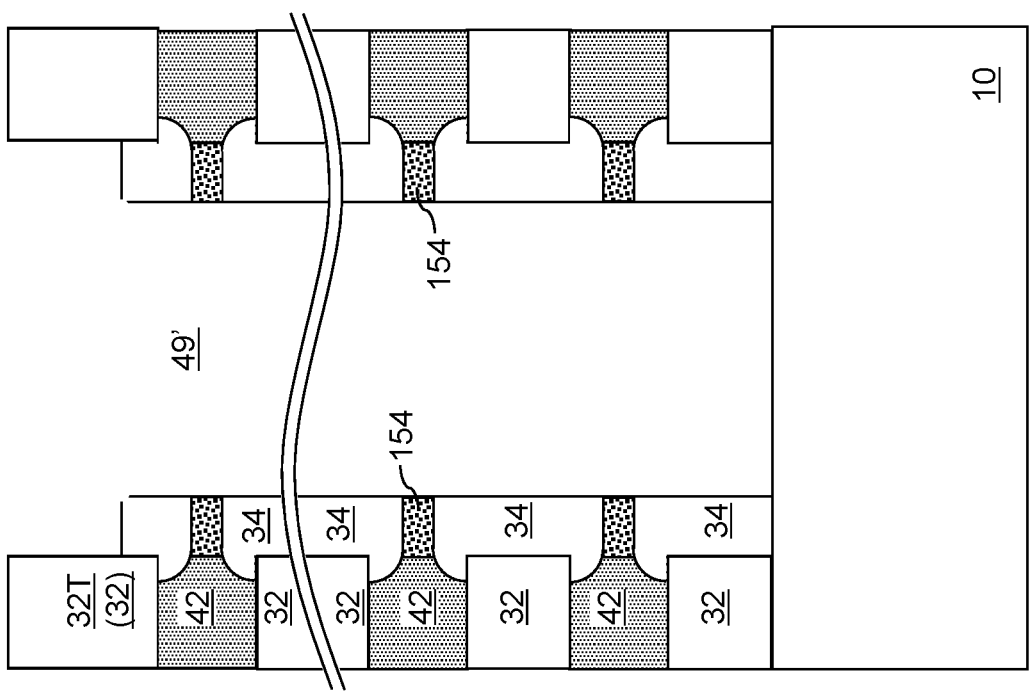
FIG. 6D
FIG. 6C

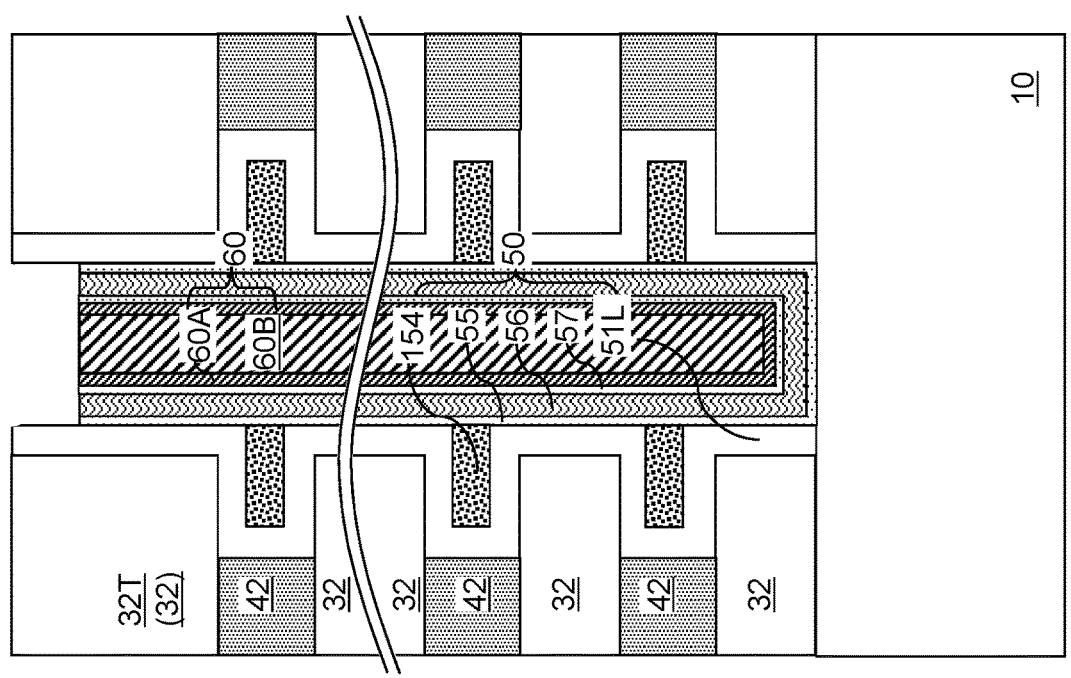
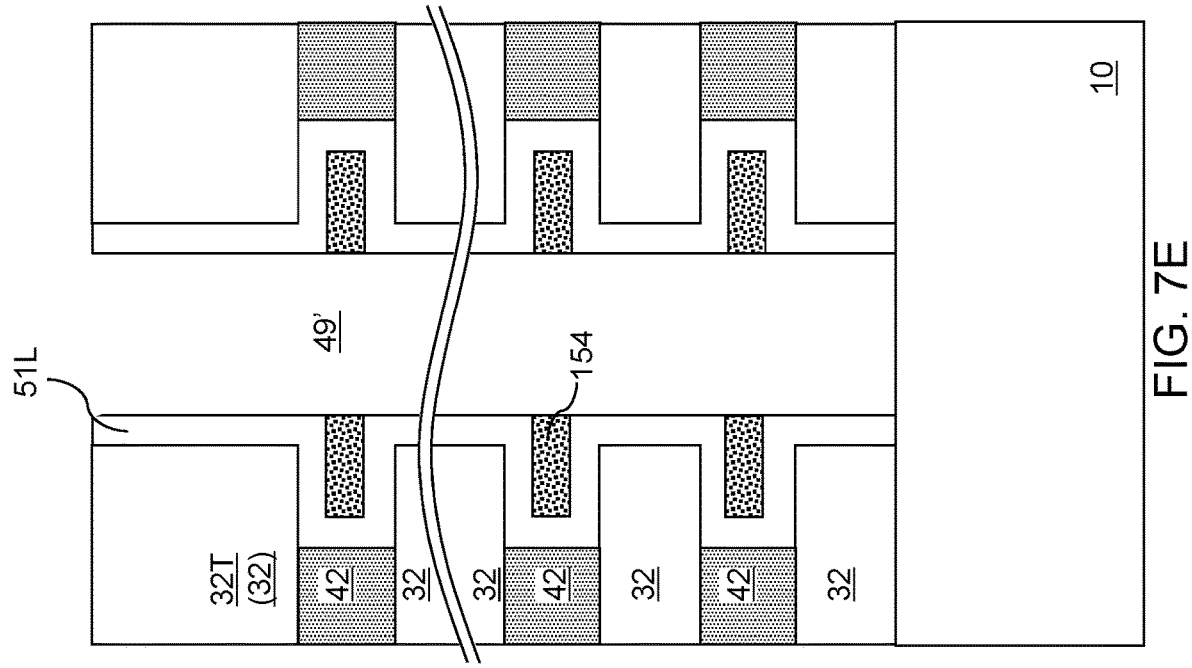
FIG. 7E
FIG. 7F

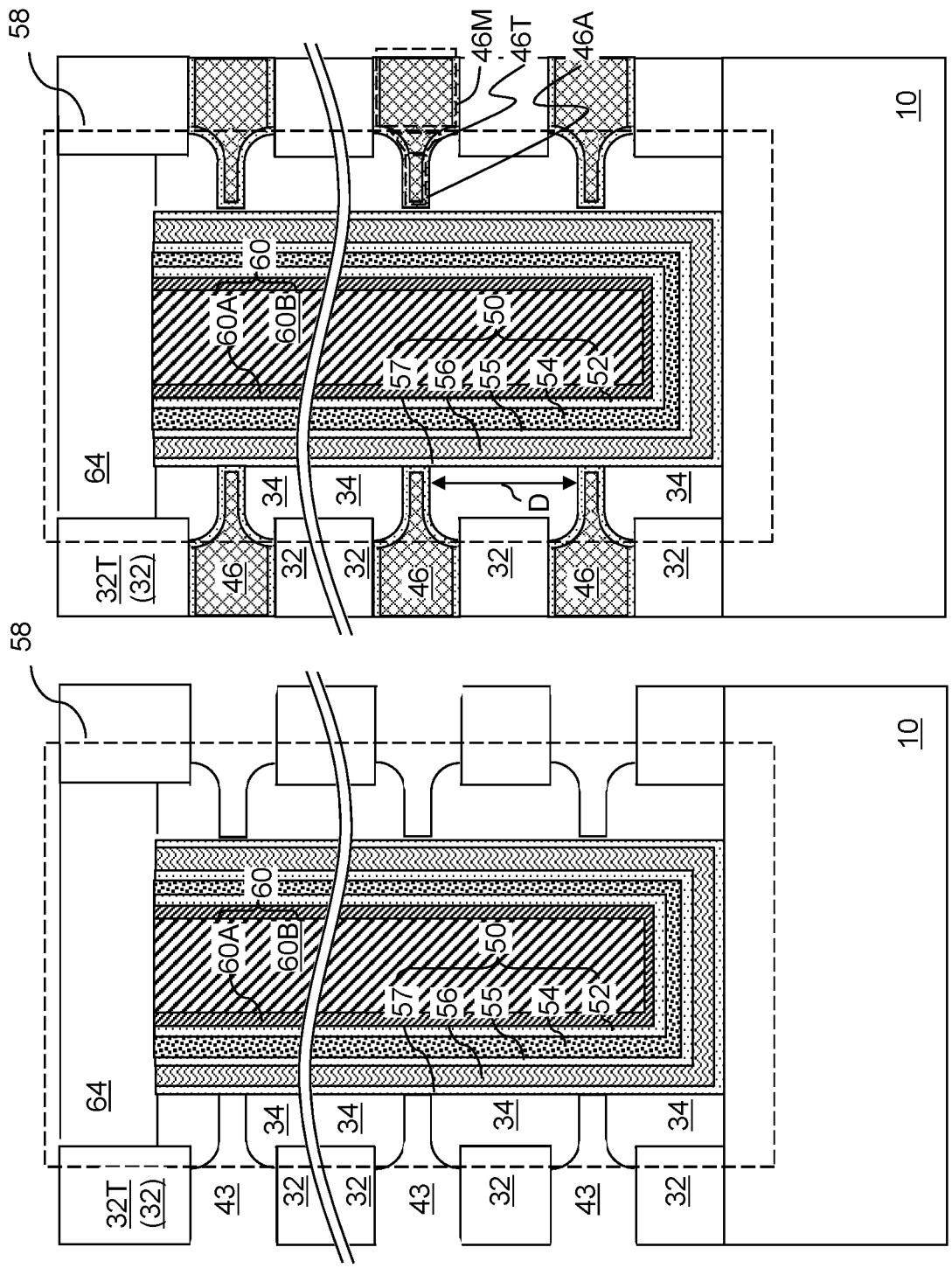

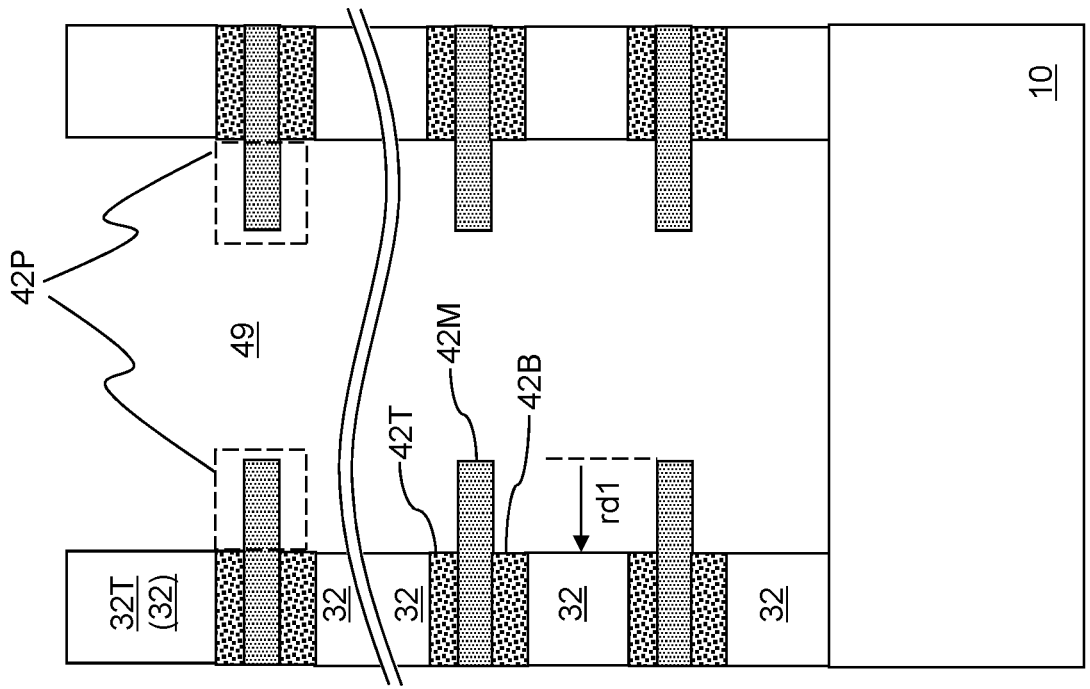
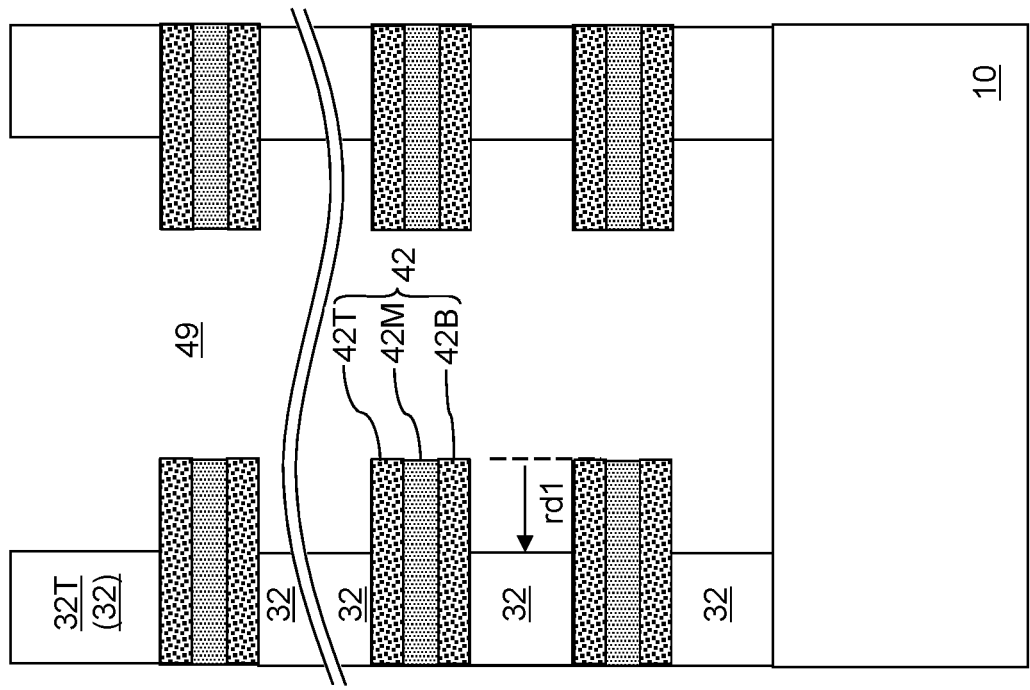

THREE-DIMENSIONAL PHASE CHANGE MEMORY DEVICE INCLUDING VERTICALLY CONSTRICTED CURRENT PATHS AND METHODS OF MANUFACTURING THE SAME

FIELD

The present disclosure relates generally to the field of semiconductor devices, and particular to a three-dimensional phase change memory device containing vertically constricted current paths and methods of manufacturing the same.

BACKGROUND

A phase change material (PCM) memory device (also known as a phase change random access memory "PCRAM" or "PRAM") is a type of non-volatile memory device that stores information as a resistivity state of a material that can be in different resistivity states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change material amorphous in a first part of a programming process. The second part of the programming process includes control of the cooling rate of the phase change material. If rapid quenching occurs, the phase change material can cool into an amorphous high resistivity state. If slow cooling occurs, the phase change material can cool into a crystalline low resistivity state.

SUMMARY

According to an aspect of the present disclosure, a three-dimensional memory device comprises an alternating stack of insulating layers and electrically conductive layers located over a substrate, and memory openings extending through the alternating stack and filled within a respective memory opening fill structure. Each memory opening fill structure comprises a vertical bit line and a vertical stack of discrete phase change memory material portions; and each of the discrete phase change memory material portions in the vertical stack is located between a respective vertically neighboring pair of the insulating layers within the alternating stack and has a vertical thickness that is less than a vertical thickness of a respective electrically conductive layer located between the respective vertically neighboring pair of the insulating layers within the alternating stack.

According to another aspect of the present disclosure, a three-dimensional memory device comprises an alternating stack of insulating layers and electrically conductive layers located over a substrate, and memory openings extending through the alternating stack and filled within a respective memory opening fill structure. Each memory opening fill structure comprises a vertical bit line and phase change memory material laterally surrounding the vertical bit line, and each of the electrically conductive layers within the alternating stack comprises a word line containing a matrix portion located between neighboring pairs of memory openings, and a plurality of protruding portions that protrude toward, and laterally surround, a respective one of the memory openings.

According to yet another aspect of the present disclosure, a method of forming a three-dimensional memory device is provided, which comprises: forming an alternating stack of insulating layers and sacrificial material layers over a substrate; forming memory openings through the alternating stack; forming protruding tip portions on each of the sacrificial material layers around the memory openings; forming a plurality of insulating spacers within each memory opening between each vertically neighboring pair of tip portions of the sacrificial material layers on a respective one of the insulating layers; depositing a phase change memory material and a vertical bit line within each of the memory openings; and replacing each of the sacrificial material layer with an electrically conductive layer.

BRIEF DESCRIPTION OF THE DRAWINGS

FIGS. 5A-5G are sequential schematic vertical cross-sectional views of a memory opening within the exemplary structure during formation of a memory opening fill structure in a first configuration according to an embodiment of the present disclosure.

FIGS. 6A-6E are sequential schematic vertical cross-sectional views of a memory opening within the exemplary structure during formation of a memory opening fill structure in a second configuration according to an embodiment of the present disclosure.

FIGS. 7A-7G are sequential schematic vertical cross-sectional views of a memory opening within the exemplary structure during formation of a memory opening fill structure in a third configuration according to an embodiment of the present disclosure.

FIGS. 11A and 11B are sequential vertical cross-sectional views of a region around a memory opening fill structure in the first configuration during formation of electrically conductive layers according to an embodiment of the present disclosure.

FIGS. 18A-18D are sequential schematic vertical cross-sectional views of steps in a method of making an exemplary structure according to another embodiment of the present disclosure.

DETAILED DESCRIPTION

Figure 1:
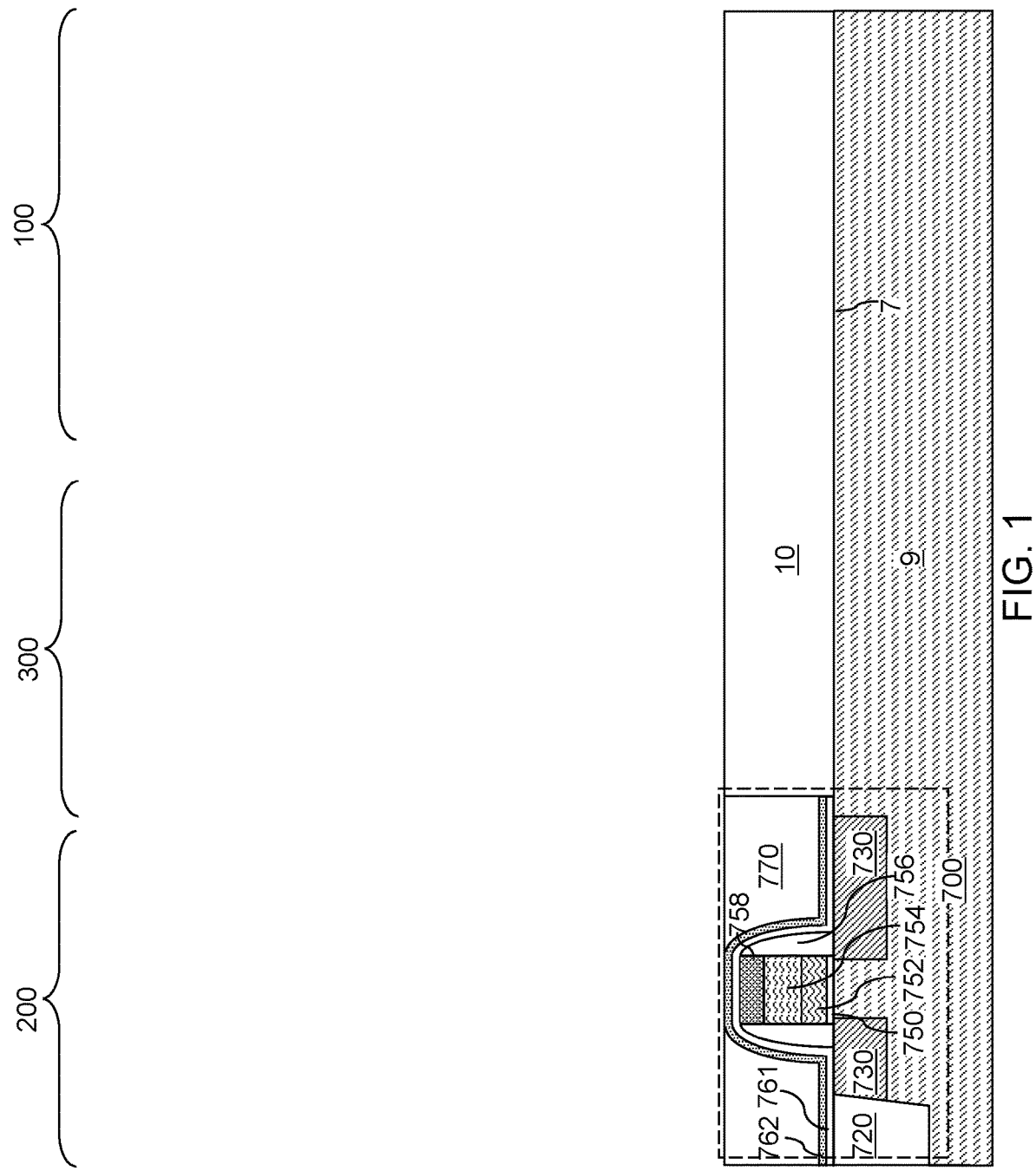
FIG. 1 is a schematic vertical cross-sectional view of an exemplary structure after formation of at least one peripheral device and a insulating material layer according to an embodiment of the present disclosure.

As discussed above, the embodiments of the present disclosure are directed to three-dimensional phase change memory devices including vertically constricted current paths between the word lines and the phase change material in each memory cell and methods of manufacturing the same.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Referring to FIG. 1, an exemplary structure according to an embodiment of the present disclosure is illustrated. The exemplary structure includes a substrate 9. The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

An insulating material layer 10 is formed on the top surface of the substrate semiconductor layer 9 prior to, or after, formation of the at least one semiconductor device 700 by deposition of an insulating material, for example, by chemical vapor deposition. The insulating material layer can be any insulating material, such as silicon oxide, and may have a thickness of 50 nm to 300 nm. Portions of the deposited insulating material located above the top surface of the planarization dielectric layer 770 can be removed, for example, by chemical mechanical planarization (CMP). In this case, the insulating material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
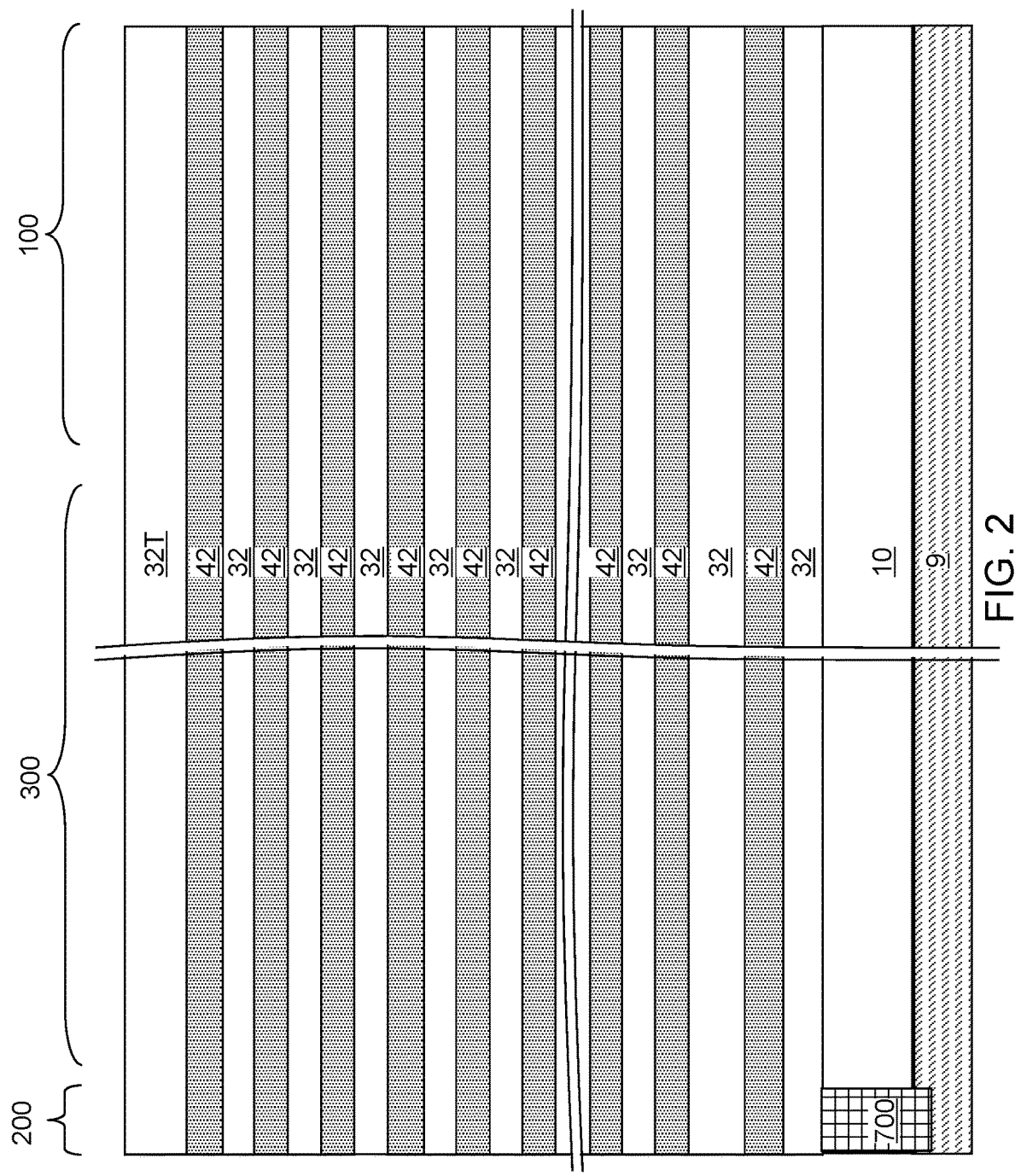
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate 9. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as word lines. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the word lines of a memory device to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

The topmost layer of the alternating stack (32, 42) may be a topmost insulating layer 32T, i.e., a topmost one of the insulating layers 32. The topmost insulating layer 32T can have a greater thickness than each of the underlying insulating layers 32.

Figure 3:
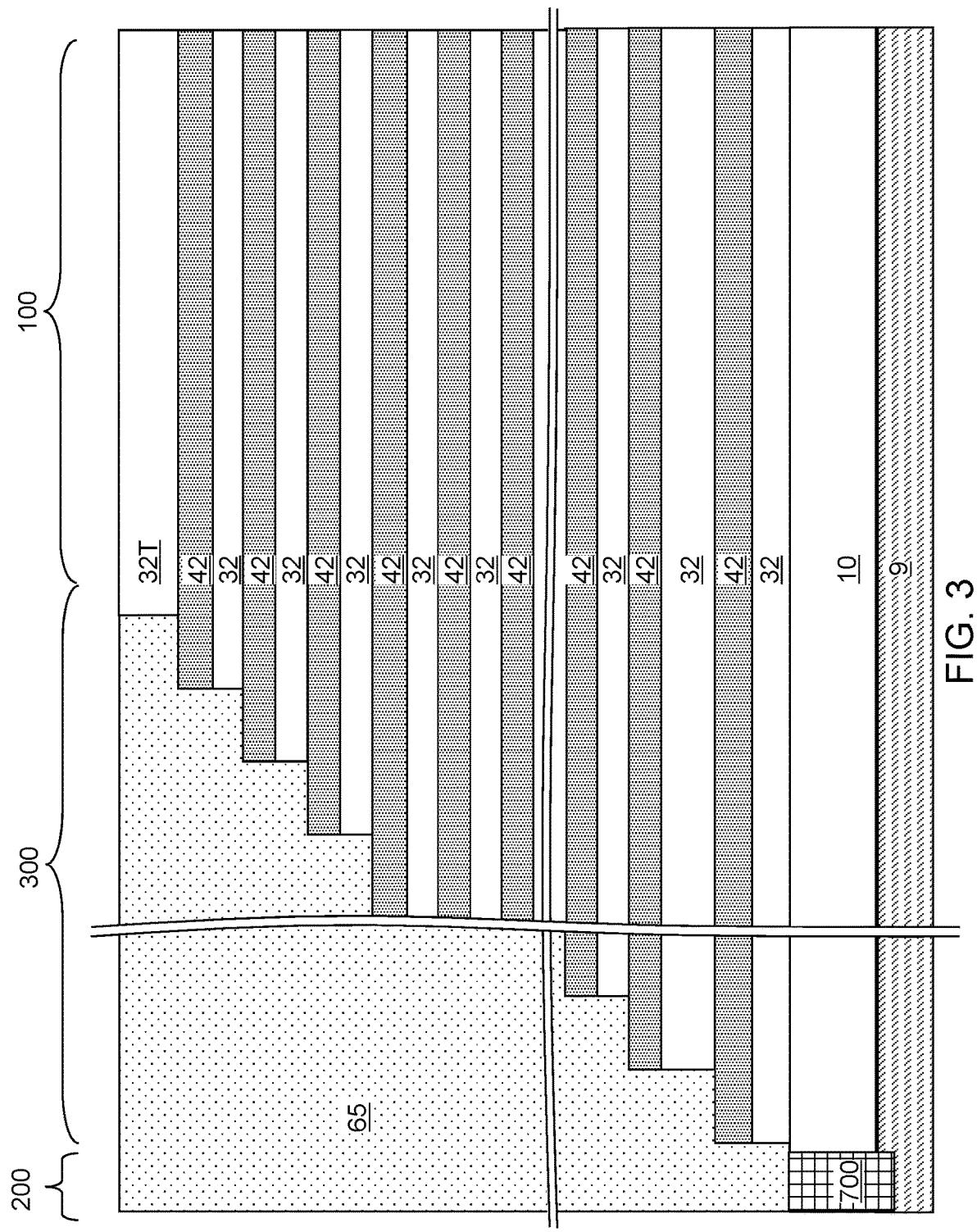
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory opening fill structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
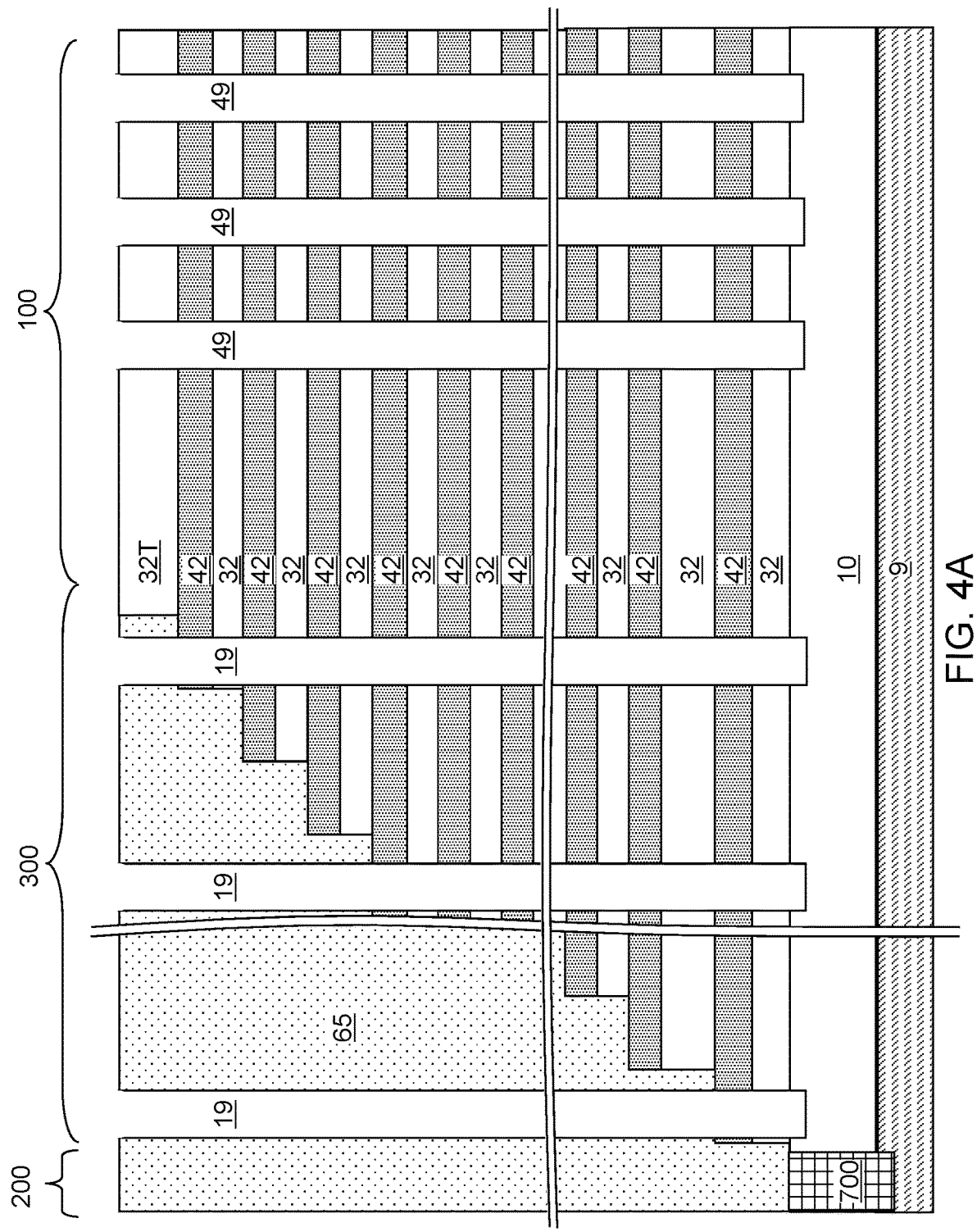
FIG. 4A is a schematic vertical cross-sectional view of the exemplary structure after formation of memory openings and support openings according to an embodiment of the present disclosure.
Figure 4B:
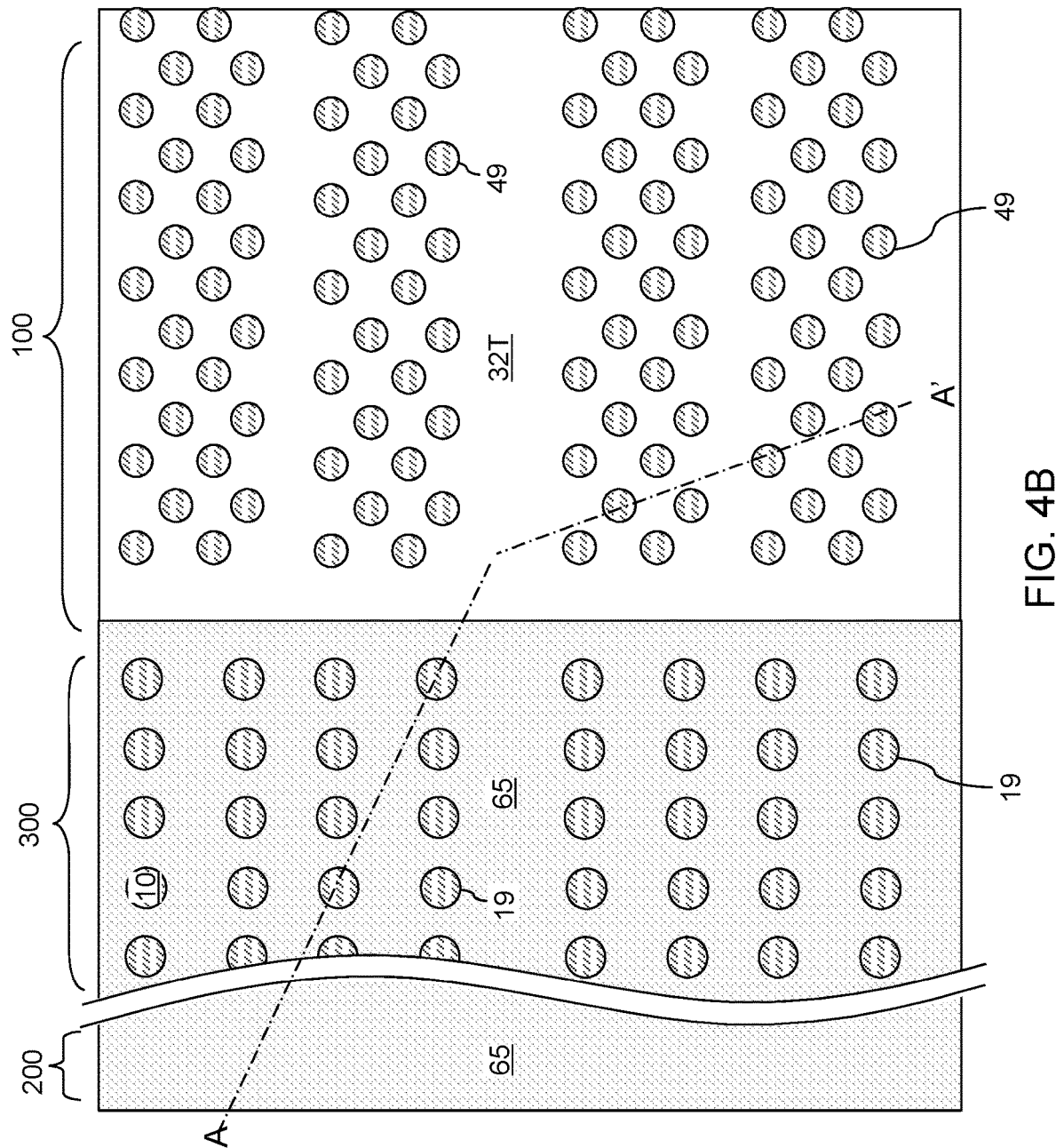
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory opening fill structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the insulating material layer 10. In one embodiment, an overetch into the insulating material layer 10 may be optionally performed after the top surface of the insulating material layer 10 is physically exposed at a bottom of each memory opening 49 and each support opening 19. The overetch may be performed prior to, or after, removal of the lithographic material stack. In other words, the recessed surfaces of the insulating material layer 10 may be vertically offset from the un-recessed top surfaces of the insulating material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the insulating material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300.

FIGS. 5A-5G illustrate structural changes in a memory opening 49 during formation of a memory opening fill structure in a first configuration according to a first embodiment. The memory opening 49 illustrated in FIGS. 5A-5G can by any of the memory openings 49 in the exemplary structure of FIGS. 4A and 4B. The same structural change occurs simultaneously in each of the other memory openings 49 and in each of the support openings 19.

Figure 5B:
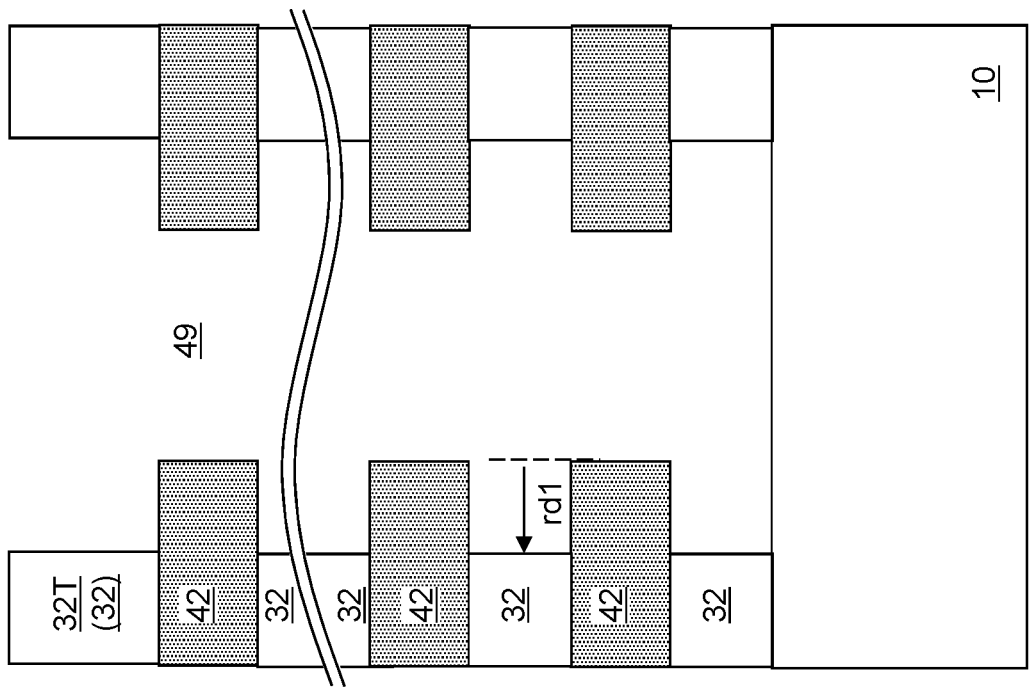
Figure 5A:
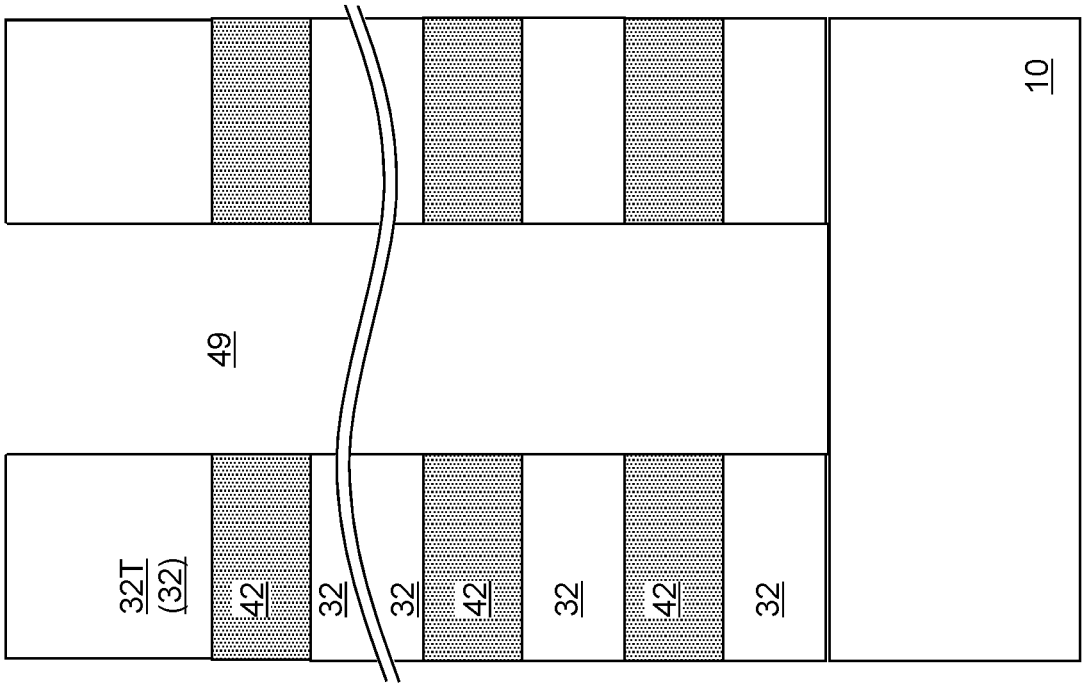

Referring to FIG. 5A, a memory opening 49 in the exemplary device structure of FIGS. 4A and 4B is illustrated. The memory opening 49 extends through the topmost insulating layer 32T, the alternating stack (32, 42), and optionally into an upper portion of the insulating material layer 10. At this processing step, each support opening 19 can extend through the retro-stepped dielectric material portion 65, a subset of layers in the alternating stack (32, 42), and optionally through the upper portion of the insulating material layer 10. The recess depth of the bottom surface of each memory opening with respect to the top surface of the insulating material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, the insulating layers 32 can be isotropically recessed selective to the sacrificial material layers 42 around each memory opening 49 by a first recess distance rd1 by performing a first isotropic etch process. For example, if the insulating layers 32 include silicon oxide and if the sacrificial material layers 42 include silicon nitride, the first isotropic etch process can include a wet etch process employing dilute hydrofluoric acid. The first recess distance rd1 may be, or may not be, greater than one half of the average thickness of the insulating layers 32 other than the topmost insulating layer 32T. For example, the first recess distance rd1 can be in a range from 5 nm to 100 m, such as from 10 nm to 50 nm, although lesser and greater recess distances can also be employed.

Figure 5C:
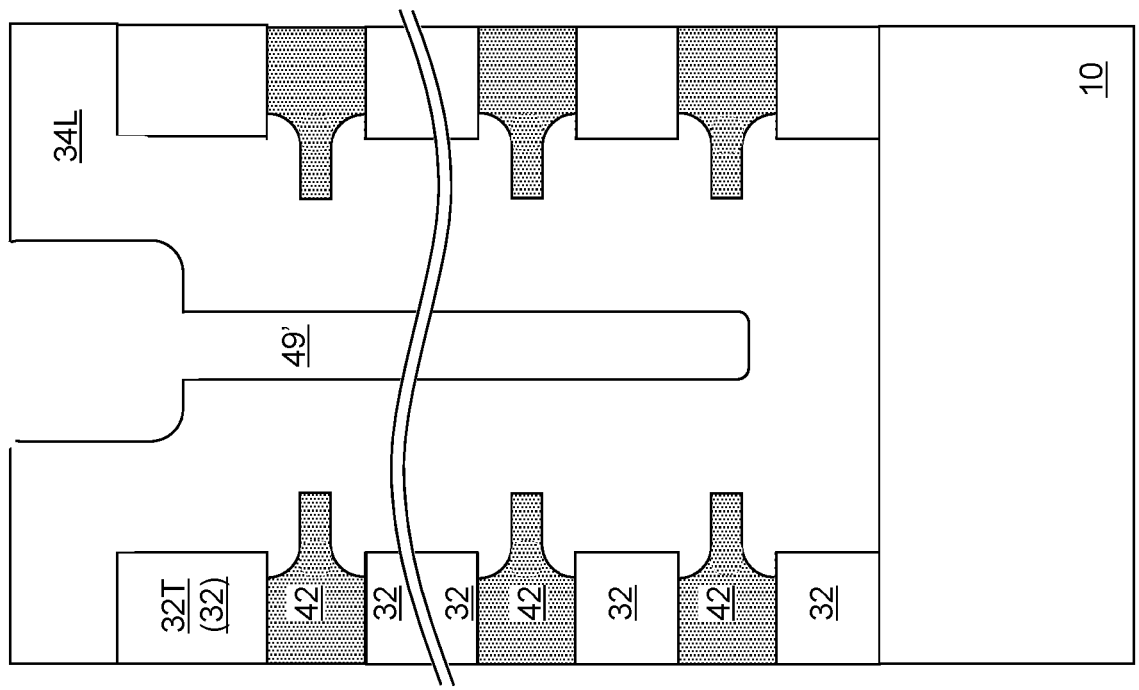

Referring to FIG. 5C, the sacrificial material layers 42 can be isotropically recessed (e.g., slimmed and tapered) selective to the insulating layers 32 by a second recess distance rd2 by performing a second isotropic etch process. An etch chemistry that etches the material of the sacrificial material layers 42 selective to the material of the insulating layers 32 can be employed for the second isotropic etch process. For example, if the insulating layers 32 include silicon oxide and if the sacrificial material layers 42 include silicon nitride, a wet etch process employing phosphoric acid, or a mixture of hydrofluoric acid and glycerol at an elevated temperature, or a mixture of ethylene glycol, acetic acid, nitric acid, and ammonium fluoride at an elevated temperature.

The second recess distance rd2 is less than the first recess distance rd1, and is less than the one half of the minimum thickness of the sacrificial material layers 42. In one embodiment, all of the sacrificial material layers 42 can have a same thickness, and the second recess distance rd2 can be in a range from 5% to 45%, such as from 10% to 40%, of the thickness of the sacrificial material layers 42. Protruding tip portions 42P that laterally protrude toward a geometrical center of a respective memory opening 49 can be formed on each of the sacrificial material layers 42 around the memory openings 49. Each protruding tip portion 42P of a sacrificial material layer 42 can be ring-shaped, and can have a uniform thickness in an inner region, and an upper concave surface that adjoins a horizontal surface of an overlying insulating layer 32 and a lower concave surface that adjoins a horizontal top surface of an underlying insulating layer 32 in an outer region. Each protruding tip portion 42P may have a cylindrical vertical sidewall that adjoins an inner periphery of an upper annular surface and an inner periphery of a lower annular surface. The thickness of each protruding tip portion 42P can be in a range from 4 nm to 40 nm, such as from 8 nm to 20 nm, although lesser and greater thicknesses can also be employed.

Figure 5D:
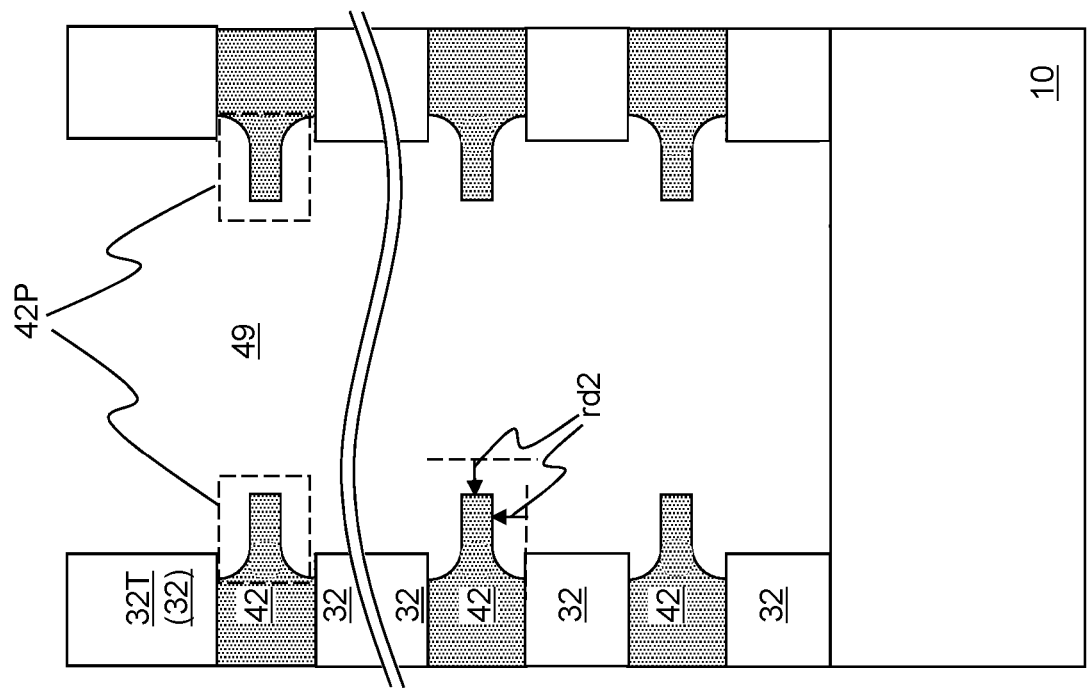

Referring to FIG. 5D, an insulating fill material layer 34L can be conformally deposited within volumes formed by the second isotropic etch process, at a periphery of each memory opening 49, and over the topmost insulating layer 32T. The thickness of the insulating fill material layer 34L can be selected such that all volumes within the memory opening that have an areal overlap with the sacrificial material layers 42 are filled within the insulating fill material layer 34L, and a memory cavity 49' is present within each of the memory openings 49. As used herein, an areal overlap refers to an overlap of components as viewed from an axis passing through a geometrical center of a most proximal memory opening. The insulating fill material layer 34L includes an insulating material that is different from the material of the sacrificial material layers 42. For example, the insulating fill material layer 34L can include undoped silicate glass (e.g., silicon oxide), a doped silicate glass, or organosilicate glass. The material composition of the insulating fill material layer 34L may be the same as, or may be different from, the material composition of the insulating layers 32.

Referring to FIG. 5E, the insulating fill material layer 34L can be isotropically etched by performing a third isotropic etch process. The third isotropic etch process isotropically etches the material of the insulating fill material layer 34L. Remaining portions of the insulating fill material layer 34L that remain in the volumes formed by the second isotropic etch process constitute a plurality of insulating spacers 34. Optionally, an anisotropic etch process may be performed such that inner sidewalls of the insulating spacers 34 are vertically coincident within inner sidewalls of the protruding tip portions of the sacrificial material layers 42. A plurality of insulating spacers 34 can be formed within each memory opening 49 between each vertically neighboring pair of tip portions of the sacrificial material layers 42 and on a respective one of the insulating layers 32. A memory cavity 49' is prevent within each memory opening 49.

Referring to FIG. 5F, continuous material layers can be sequentially deposited in the memory cavities 49' and in unfilled volumes of the support openings. The continuous material layers can include, for example, an optional selector-side spacer layer 57, a selector material layer 56, an optional intermediate spacer layer 55, a phase change memory material layer 54, an optional memory-side spacer layer 52, and a vertical bit line 60. The set of the selector-side spacer layer 57, the selector material layer 56, the intermediate spacer layer 55, the phase change memory material layer 54, and the memory-side spacer layer 52 constitutes a memory film 50.

The phase change memory material layer 54 includes a phase change memory material. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the phase change memory material layer 54 can be in a range from 1 nm to 60 nm, such as from 10 nm to 50 nm and/or from 20 nm to 40 nm, although lesser and greater thicknesses can also be employed.

The selector material layer 56 includes a non-Ohmic material that provides electrical connection of electrical isolation depending on the magnitude and/or the polarity of an externally applied voltage bias thereacross. In one embodiment, the selector material layer 56 includes at least one threshold switch material layer. The at least one threshold switch material layer includes any suitable threshold switch material which exhibits non-linear electrical behavior, such as an ovonic threshold switch material or volatile conductive bridge. In another embodiment, the selector material layer 56 includes at least one non-threshold switch material layer, such as a tunneling selector material or diode materials (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is lowered below a critical holding voltage. Throughout the resistive state changes, the ovonic threshold switch material can remain non-crystalline (e.g., amorphous). In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer can include a selector material layer 56 which contains any ovonic threshold switch material. In one embodiment, the selector material layer 56 can include, and/or can consist essentially of, a GeSeAs alloy, a GeTeAs, a GeSeTeSe alloy, a GeSe alloy, a SeAs alloy, a GeTe alloy, or a SiTe alloy.

In one embodiment, the material of the selector material layer 56 can be selected such that the resistivity of the selector material layer 56 decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer 56 can be selected such that the critical bias voltage magnitude can be in a range from 1 V to 6 V, although lesser and greater voltages can also be employed for the critical bias voltage magnitude. The thickness of the selector material layer 56 can be, for example, in a range from 1 nm to 50 nm, such as from 5 nm to 25 nm, although lesser and greater thicknesses can also be employed.

Each of the selector-side spacer layer 57, the intermediate spacer layer 55, and the memory-side spacer layer 52 is optional, and can include a material that can control conduction of electrical current thereacross at a suitable level. For example, each of the selector-side spacer layer 57, the intermediate spacer layer 55, and the memory-side spacer layer 52 can independently include any material selected from a conductive metallic nitride such as titanium nitride, tungsten or tungsten nitride, a conductive metallic carbide, selenium, tellurium, doped silicon, germanium, an elemental metal such as silver, copper, or aluminum, amorphous carbon or diamondlike carbon (DLC), carbon nitride, an intermetallic alloy or an alloy of at least one metallic element and at least one non-metallic element, an alloy of any of the preceding materials, and/or a layer stack including a plurality of the preceding materials. Some of the above materials, such as carbon, may also function as a thermally insulating material. Each of the selector-side spacer layer 57, the intermediate spacer layer 55, and the memory-side spacer layer 52 can have a thickness in a range from 1 nm to 30 nm, such as from 3 nm to 10 nm, although lesser and greater thicknesses can be employed for each of the selector-side spacer layer 57, the intermediate spacer layer 55, and the memory-side spacer layer 52.

The vertical bit line 60 includes at least one conductive material, which can comprise at least one metallic material or at least one heavily doped (conductive) semiconductor material. For example, the vertical bit line 60 can include a metallic nitride liner 60A including a metallic nitride material (such as TiN, TaN, or WN) and a metallic fill material portion 60B including a metallic fill material (such as W, Cu, Co, Ru, or Mo).

A planarization process can be performed to remove portions of the various material layers from above the horizontal plane including the top surface of the topmost insulating layer 32T. The planarization process can include, for example, a recess etch process that indiscriminately etches the various material layers of the memory film 50 and the vertical bit line 60. In one embodiment, the recess etch process can be extended until remaining material portions of the memory film 50 and the vertical bit line 60 within each memory openings 49 have top surfaces between the horizontal plane including the top surface of the topmost insulating layer 32T and the horizontal plane including the bottom surface of the topmost insulating layer 32T.

In the first configuration, the phase change memory material is deposited in each of the memory openings 49 as a continuous material layer that extends through each of the sacrificial material layers 42 within the alternating stack (32, 42). Each portion of the phase change memory material layer 54 that has an areal overlap with a sidewall of the protruding tip portions 42P constitutes a phase change memory material portion that can be programmed in a completed memory device.

Figure 5G:
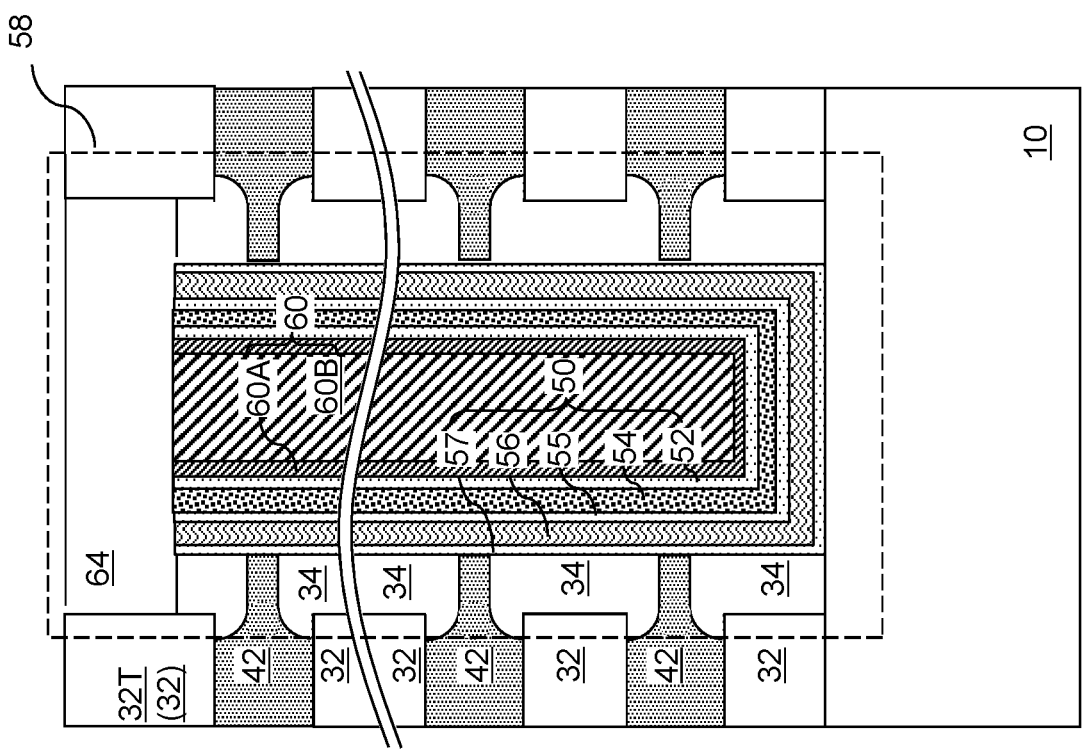

Referring to FIG. 5G, a dielectric material can be deposited in vertical recesses overlying each combination of a memory film 50 and a vertical bit line 60 within each memory opening 49. Excess portions of the dielectric material can be removed from above the horizontal plane including the top surface of the topmost insulating layer 32T. Each remaining portion of the dielectric material in the memory openings 49 constitutes a dielectric cap structure 64. The set of all material portions that fills a memory opening 49 is herein referred to as a memory opening fill structure 58, which can include a memory film 50, a vertical bit line 60, and a dielectric cap structure 64.

FIGS. 6A-6E are sequential schematic vertical cross-sectional views of a memory opening within the exemplary structure during formation of a memory opening fill structure in a second configuration according to a second embodiment of the present disclosure.

Figure 6A:
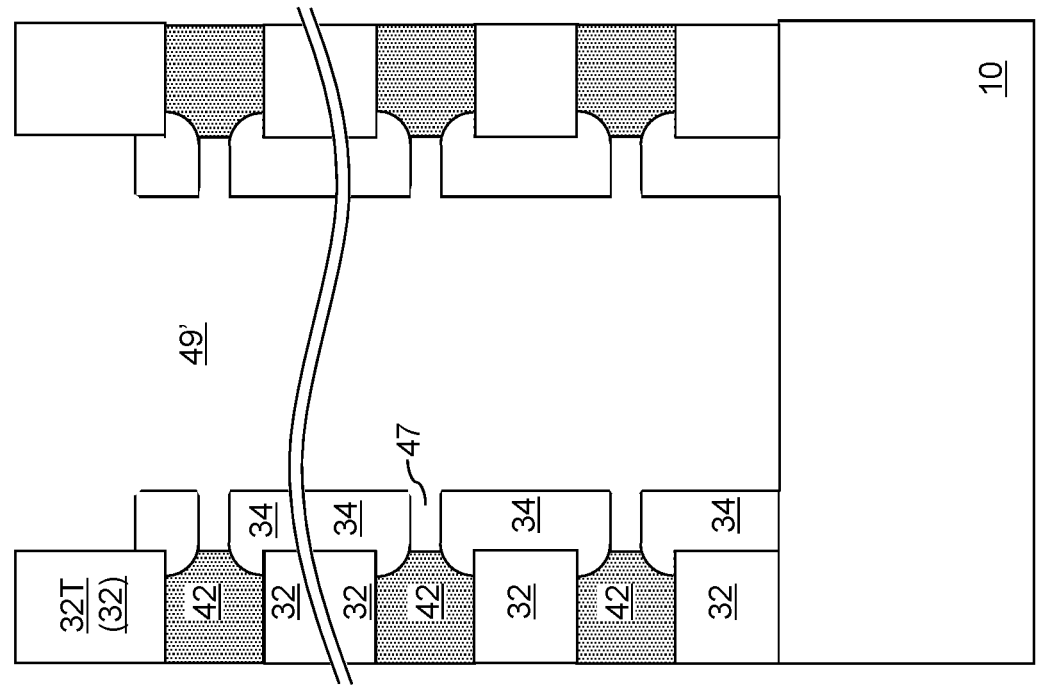

Referring to FIG. 6A, the exemplary structure at the processing steps of FIG. 5E is illustrated, which can be employed to form a memory opening fill structure in the second configuration.

Figure 6B:
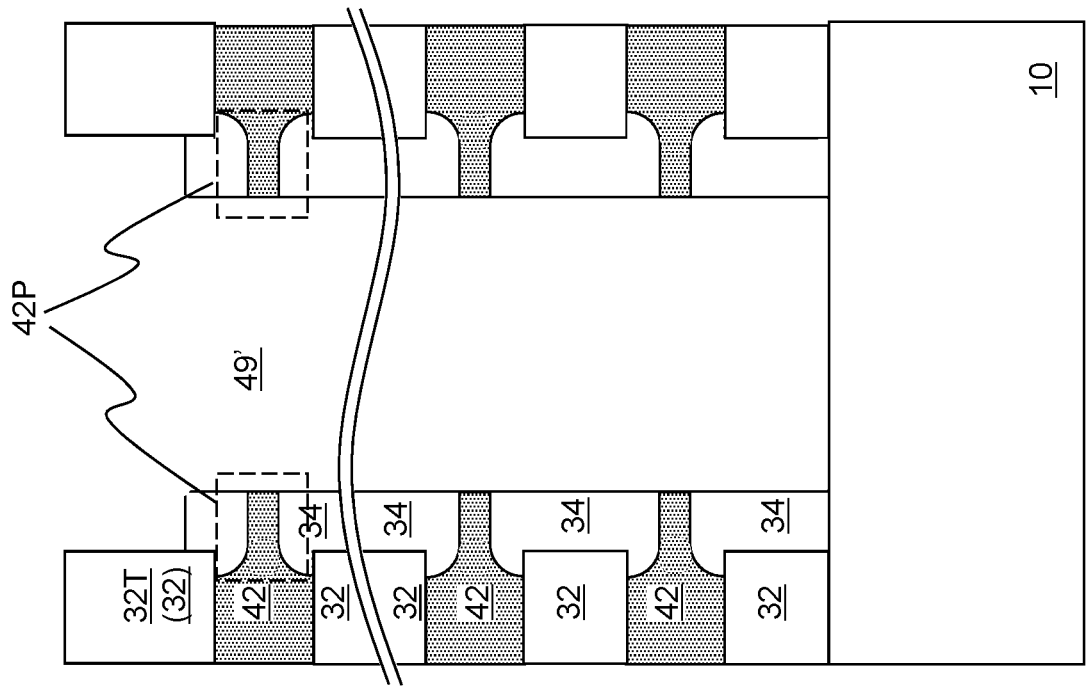

Referring to FIG. 6B, annular recess cavities 47 can be formed by selectively removing portions of the sacrificial material layers 42 between each vertically neighboring pair of insulating spacers 32. A fourth isotropic etch process can be performed to remove annular inner segments of the protruding tip portions 42P of the sacrificial material layers 42. The chemistry of the fourth isotropic etch process is selected such that the material of the sacrificial material layers 42 is etched selective to the material of the insulating layers 32. For example, if the insulating layers 32 include silicon oxide and if the sacrificial material layers 42 include silicon nitride, a wet etch process employing phosphoric acid, or a mixture of hydrofluoric acid and glycerol at an elevated temperature, or a mixture of ethylene glycol, acetic acid, nitric acid, and ammonium fluoride at an elevated temperature. The duration of the fourth isotropic etch process is selected such that outer segments of the protruding tip portions 42P of the sacrificial material layers 42 are not removed. Thus, the height of each physically exposed sidewall of the sacrificial material layers 42 after the fourth isotropic etch process is less than the height of the matrix portion of a respective sacrificial material layer 42 that adjoins the remaining outer segments of the protruding tip portions 42P and contacts an overlying insulating layer 32 and an underlying insulating layer 32. Accordingly, each annular recess cavity 47 has a lesser height than the sacrificial material layer 42 located at the same level as the respective annular recess cavity 47. In one embodiment, the annular recess cavities 47 may have a uniform height throughout. In another embodiment, the annular recess cavities 47 can extend toward the matrix portions of the sacrificial material layers 42 such that surfaces of the annular recess cavities 47 include a peripheral portion of an annular convex surface of an overlying insulating spacer 34 and a peripheral portion of an annular convex surface of an underlying insulating spacer 34.

Referring to FIG. 6C, a phase change memory material can be conformally deposited to fill the annular recess cavities 47. Portions of the phase change memory material located outside the annular recess cavities 47 can be removed by an etch-back process, which can employ an isotropic etch process or an anisotropic etch process. The etch-back process may remove portions of the phase change memory material located outside the annular recess cavities 47 selective to the material of the insulating spacers 34. Each remaining portion of the phase change memory material can have an annular configuration, and is herein referred to as an annular phase change memory material portion 154. In one embodiment, the inner sidewalls of the annular phase change memory material portions 154 within a memory opening 49 may be vertically coincident with inner sidewalls of the insulating spacers 34. The annular phase change memory material portions 154 can include any of the materials that can be employed for the phase change memory material layer 54.

Referring to FIG. 6D, continuous material layers can be sequentially deposited in the memory cavities 49' and in unfilled volumes of the support openings. The continuous material layers can include, for example, an intermediate spacer layer 55, a selector material layer 56, a selector-side spacer layer 57, and a vertical bit line 60. The set of the phase change memory material portions 154, the intermediate spacer layer 55, the selector material layer 56, and the selector-side spacer layer 57 within each memory opening 49 constitutes a memory film 50. Each of the continuous material layers can be deposited as a conformal material layer, and excess portions of the continuous material layers can be removed from above the top surface of the topmost insulating layer 32T and from an upper region of each memory opening 49 and each support opening 19 by a recess etch process.

In the second configuration, the phase change memory material is deposited in the annular recess cavities 47, and is formed as a plurality of annular phase change memory material portions 154. The annular phase change memory material portions 154 can have a lesser thickness than the matrix portion of each of the sacrificial material layers 42.

Figure 6E:
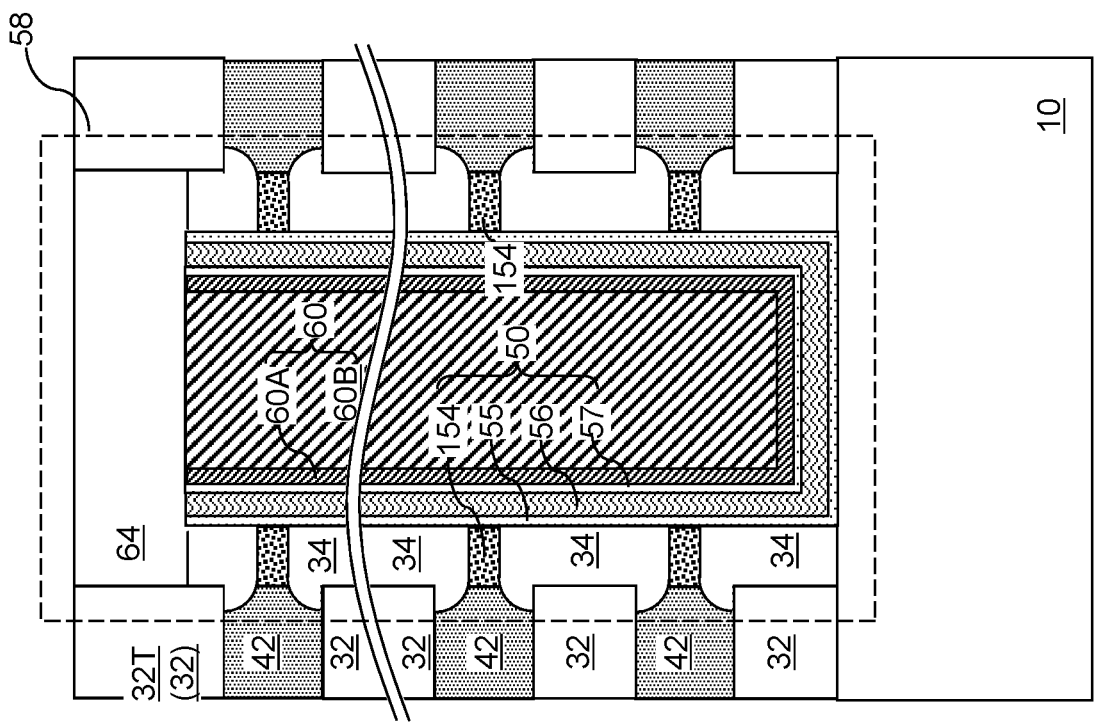

Referring to FIG. 6E, a dielectric material can be deposited in vertical recesses overlying each combination of a memory film 50 and a vertical bit line 60 within each memory opening 49. Excess portions of the dielectric material can be removed from above the horizontal plane including the top surface of the topmost insulating layer 32T. Each remaining portion of the dielectric material in the memory openings 49 constitutes a dielectric cap structure 64. The set of all material portions that fills a memory opening 49 is herein referred to as a memory opening fill structure 58, which can include a memory film 50, a vertical bit line 60, and a dielectric cap structure 64.

FIGS. 7A-7G are sequential schematic vertical cross-sectional views of a memory opening within the exemplary structure during formation of a memory opening fill structure in a third configuration according to a third embodiment of the present disclosure.

Figure 7B:
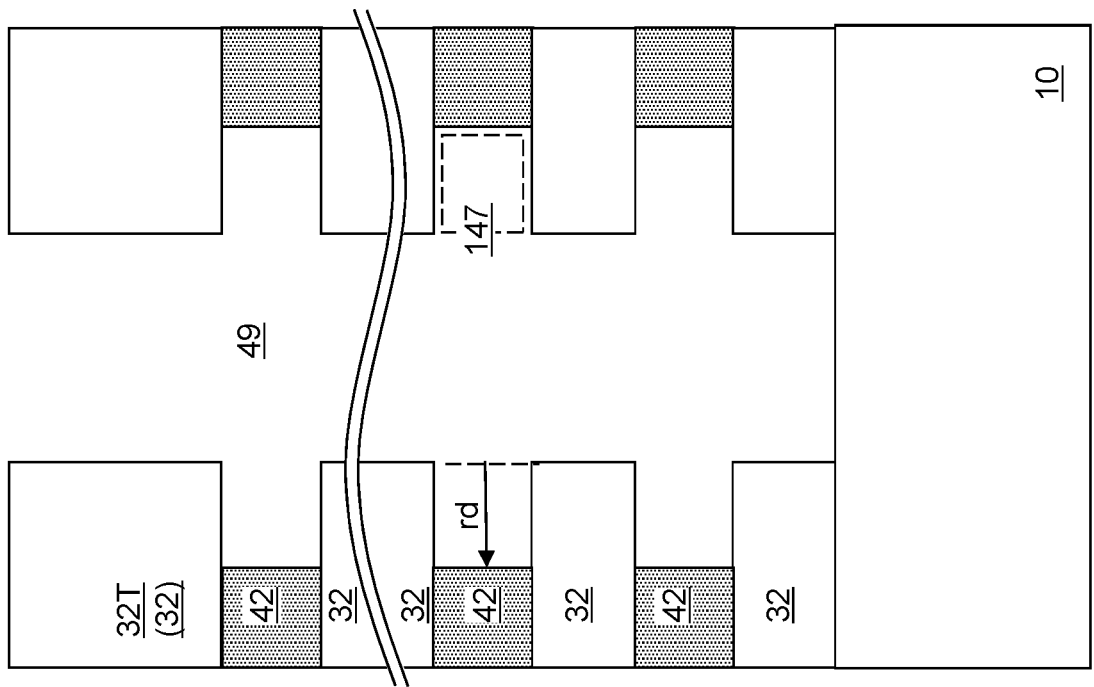
Figure 7A:
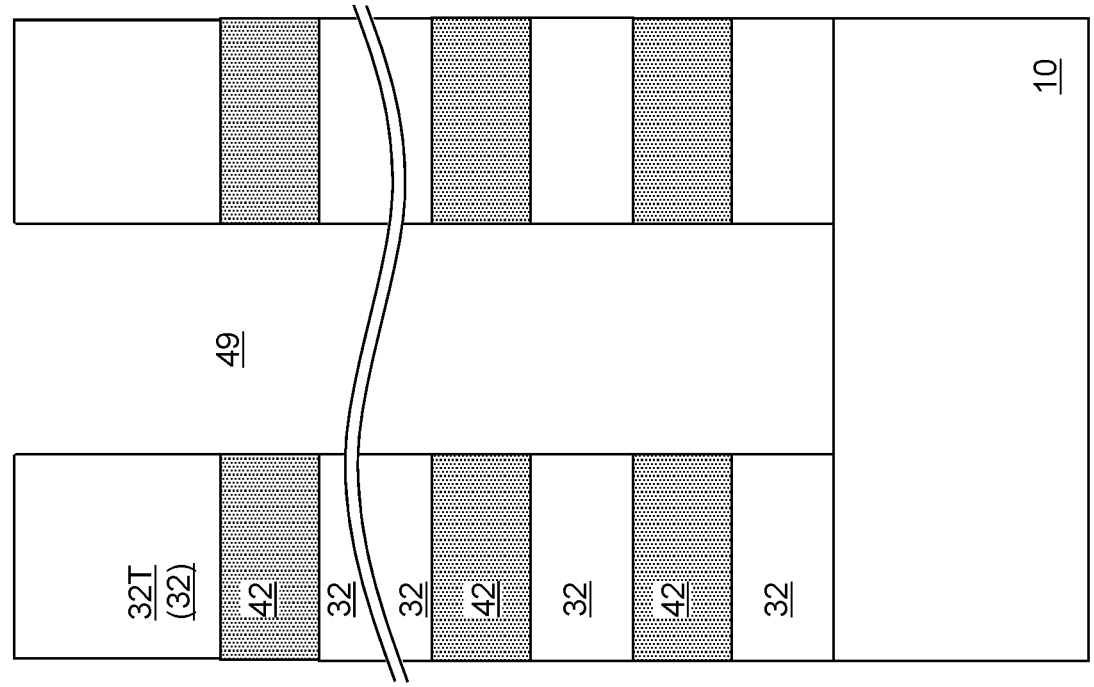

Referring to FIG. 7A, a memory opening 49 in the exemplary device structure of FIGS. 4A and 4B is illustrated. The memory opening 49 extends through the topmost insulating layer 32T, the alternating stack (32, 42), and optionally into an upper portion of the insulating material layer 10. At this processing step, each support opening 19 can extend through the retro-stepped dielectric material portion 65, a subset of layers in the alternating stack (32, 42), and optionally through the upper portion of the insulating material layer 10. The recess depth of the bottom surface of each memory opening with respect to the top surface of the insulating material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 7B, the sacrificial material layers 42 can be isotropically recessed selective to the insulating layers 32 by a recess distance rd by performing an isotropic etch process. An etch chemistry that etches the material of the selective material layers 42 selective to the material of the insulating layers 32 can be employed for the isotropic etch process. For example, if the insulating layers 32 include silicon oxide and if the sacrificial material layers 42 include silicon nitride, a wet etch process employing phosphoric acid, or a mixture of hydrofluoric acid and glycerol at an elevated temperature, or a mixture of ethylene glycol, acetic acid, nitric acid, and ammonium fluoride at an elevated temperature. The recess distance rd can be in a range from 5 nm to 200 nm, such as from 10 nm to 100 nm, although lesser and greater recess distances may also be employed. An annular recess cavity 147 can be formed in each volume formed by removal of an annular portion of a sacrificial material layer 42 around a memory opening 49. An annular recess cavity 147 can be formed between each vertically neighboring pair of insulating layers 32 around each memory opening 49.

Figure 7D:
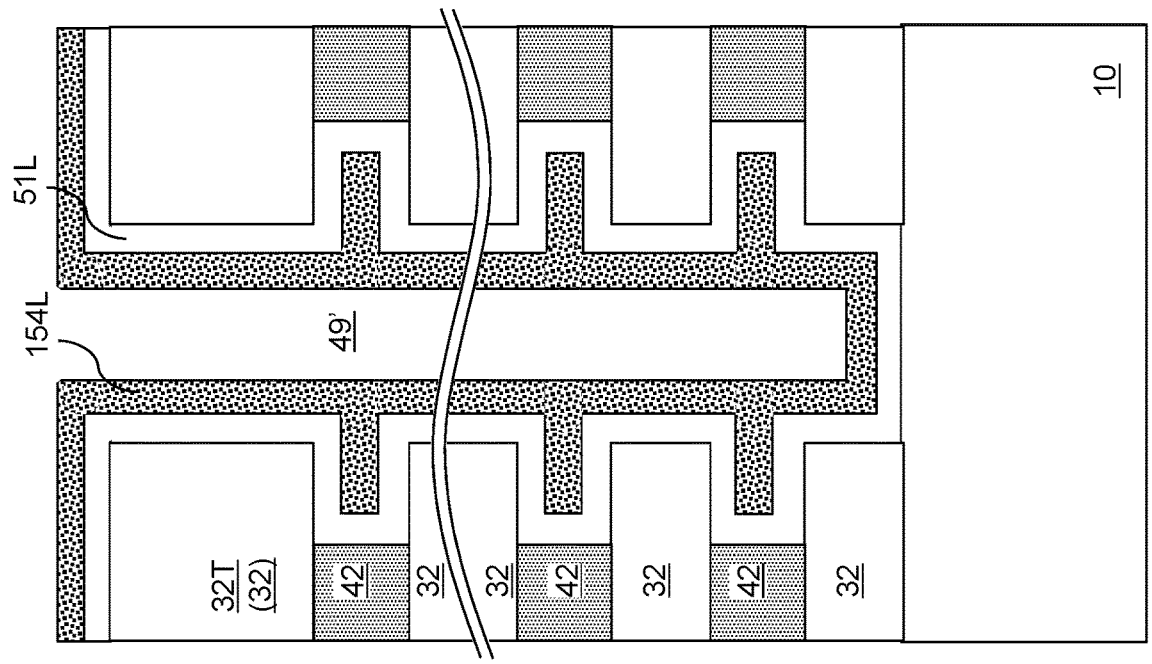
Figure 7C:
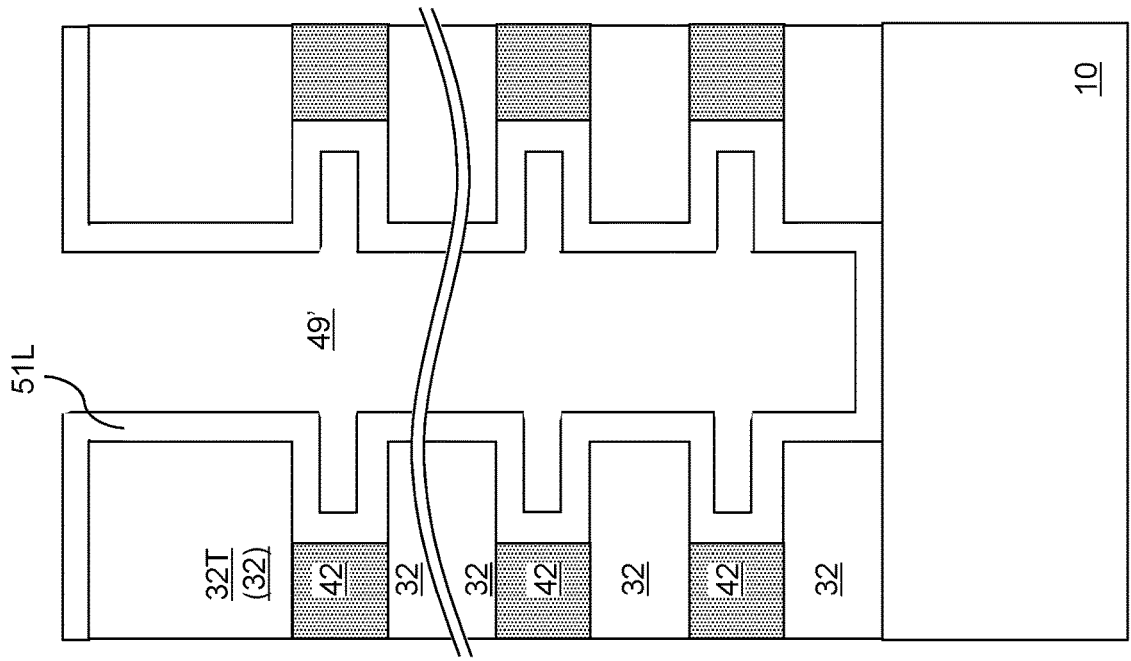

Referring to FIG. 7C, a memory-side spacer layer 51L can be deposited by a conformal deposition process. The memory-side spacer layer 51L can have the same composition and the same thickness as the memory-side spacer layer 52 described above. The thickness of the memory-side spacer layer 51L can be less than one half of the minimum height of the annular recess cavities 147. In one embodiment, the sacrificial material layers 42 can have the same thickness throughout, and each annular recess cavity 147 can have the same height as the thickness of a sacrificial material layer 42.

Referring to FIG. 7D, a phase change memory material layer 154L can be conformally deposited to fill all remaining volumes of the annular recess cavities 147. The phase change memory material layer 154L can include any material that can be employed for the phase change memory material layer 54 described above. The thickness of the phase change memory material layer 154L may be, for example, in a range from 2 nm to 60 nm, such as from 4 nm to 30 nm, although lesser and greater thicknesses can also be employed.

Referring to FIG. 7E, portions of the phase change memory material layer 154L that are not covered by an overlying portion of the memory-side spacer layer 51L can be removed by a recess etch process, which can employ an isotropic etch process and/or an anisotropic etch process. Horizontal potions of the memory-side spacer layer 51L can be collaterally removed by the recess etch process. Each remaining portion of the phase change memory material layer 154L constitutes an annular phase change memory material portion 154. In one embodiment, the inner sidewalls of the annular phase change memory material portions 154 within a memory opening 49 may be vertically coincident with an inner sidewall of the memory-side spacer layer 51L. The annular phase change memory material portions 154 can include any of the materials that can be employed for the phase change memory material layer 54.

Referring to FIG. 7F, continuous material layers can be sequentially deposited in the memory cavities 49' and in unfilled volumes of the support openings. The continuous material layers can include, for example, an intermediate spacer layer 55, a selector material layer 56, a selector-side spacer layer 57, and a vertical bit line 60. The set of the memory-side spacer layer 51L, the phase change memory material portions 154, the intermediate spacer layer 55, the selector material layer 56, and the selector-side spacer layer 57 within each memory opening 49 constitutes a memory film 50. Each of the continuous material layers can be deposited as a conformal material layer, and excess portions of the continuous material layers can be removed from above the top surface of the topmost insulating layer 32T and from an upper region of each memory opening 49 and each support opening 19 by a recess etch process.

In the third configuration, the phase change memory material is deposited within a subset of volumes of the annular recess cavities 147, and is formed as a plurality of annular phase change memory material portions 154. The annular phase change memory material portions 154 can have a lesser thickness than the matrix portion of each of the sacrificial material layers 42.

Figure 7G:
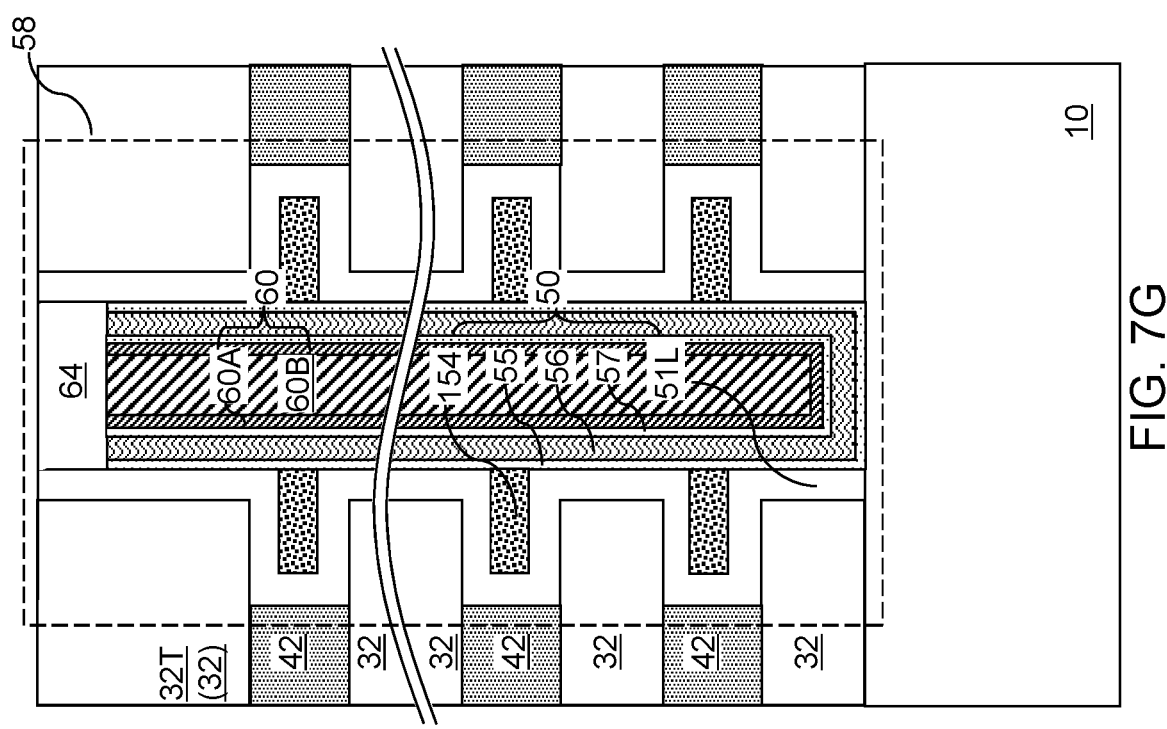

Referring to FIG. 7G, a dielectric material can be deposited in vertical recesses overlying each combination of a memory film 50 and a vertical bit line 60 within each memory opening 49. Excess portions of the dielectric material can be removed from above the horizontal plane including the top surface of the topmost insulating layer 32T. Each remaining portion of the dielectric material in the memory openings 49 constitutes a dielectric cap structure 64. The set of all material portions that fills a memory opening 49 is herein referred to as a memory opening fill structure 58, which can include a memory film 50, a vertical bit line 60, and a dielectric cap structure 64.

Figure 8:
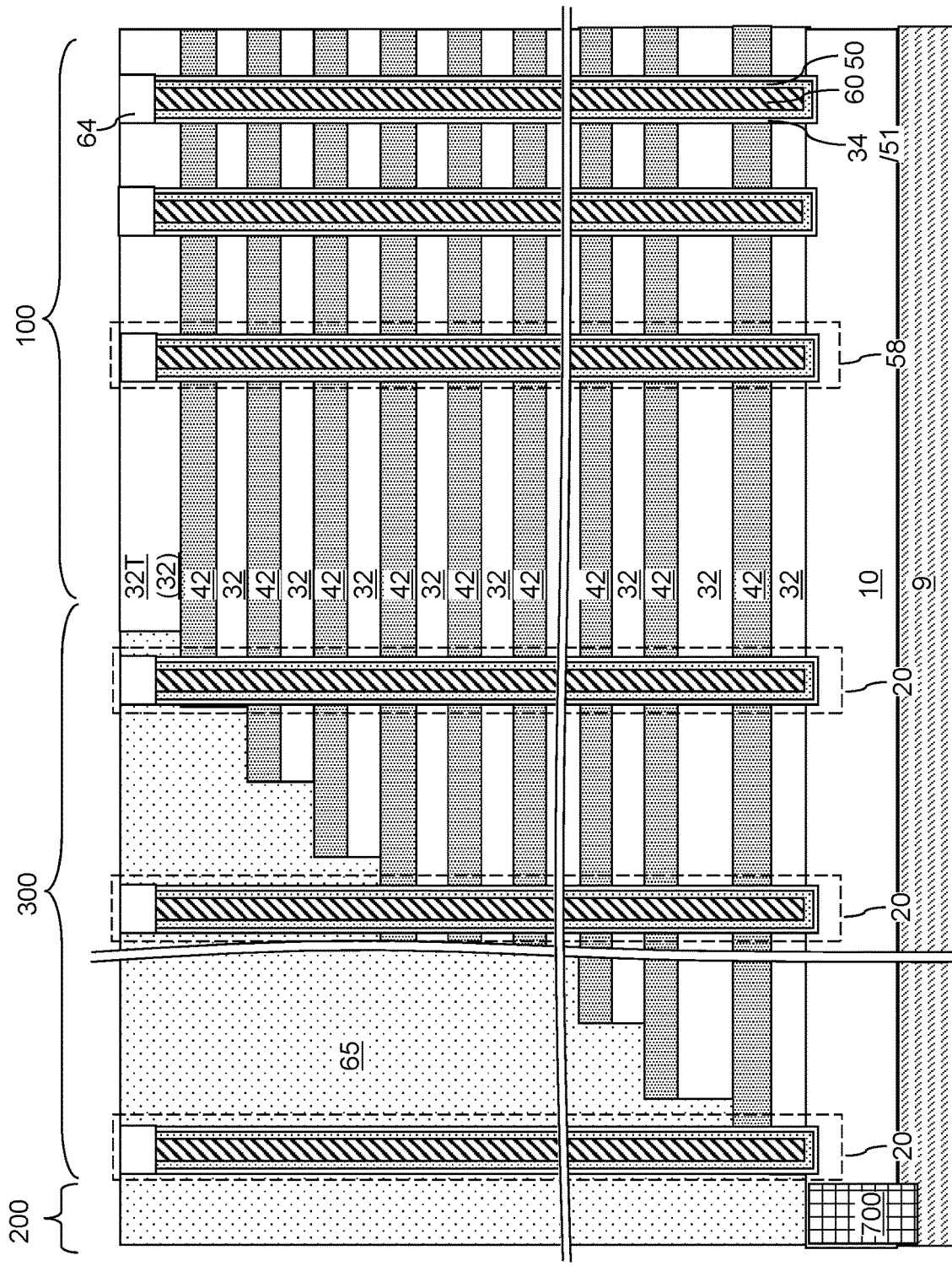
FIG. 8 is a schematic vertical cross-sectional view of the exemplary structure after formation of memory opening fill structures and support pillar structures according to an embodiment of the present disclosure.

Referring to FIG. 8, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. In one embodiment, each support pillar structure 20 can include a same set of structural components as a memory opening fill structure 20. Each memory opening fill structure 58 includes a vertical bit line 60 and a memory film 50.

Figure 9A:
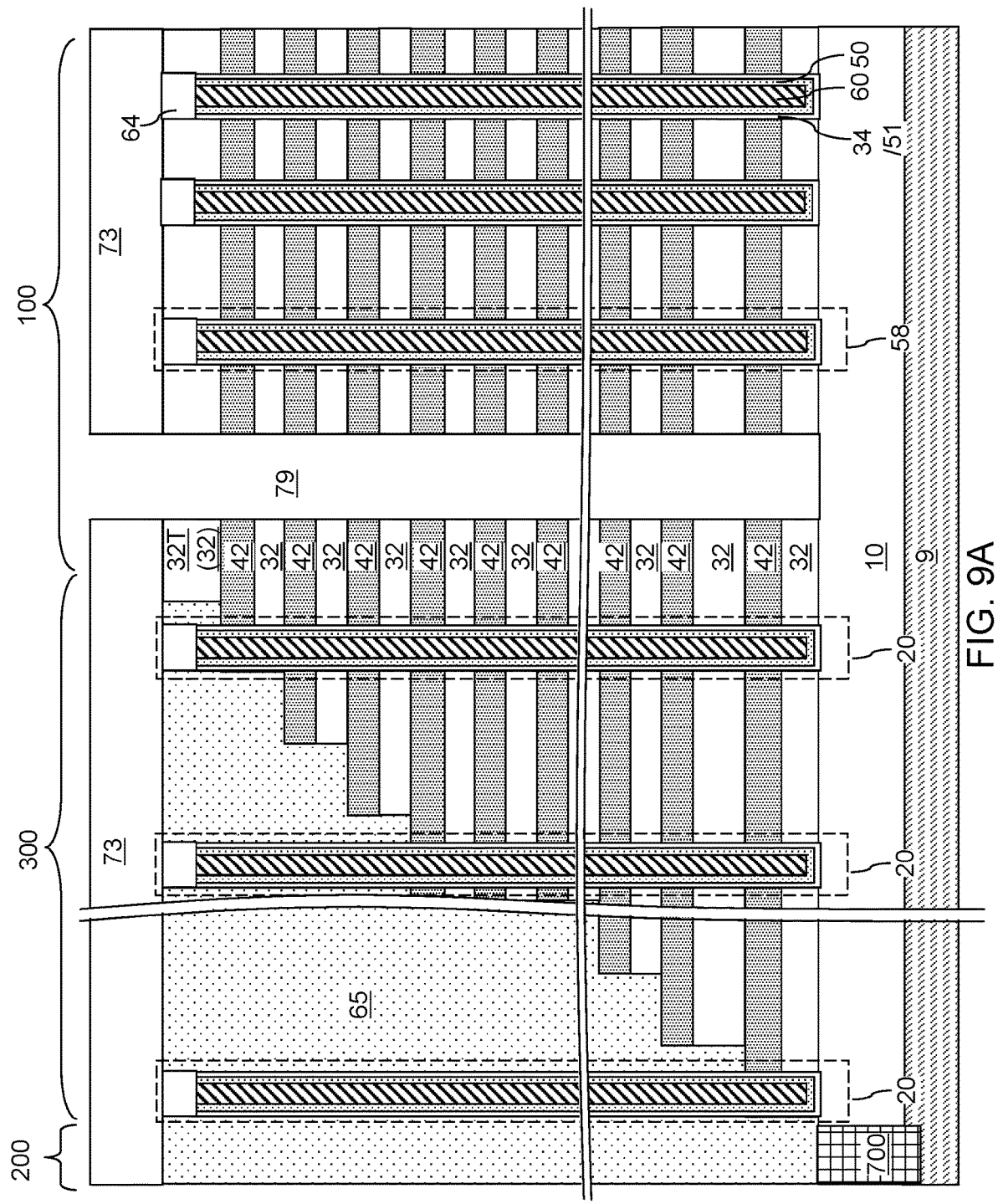
FIG. 9A is a schematic vertical cross-sectional view of the exemplary structure after formation of backside trenches according to an embodiment of the present disclosure.
Figure 9B:
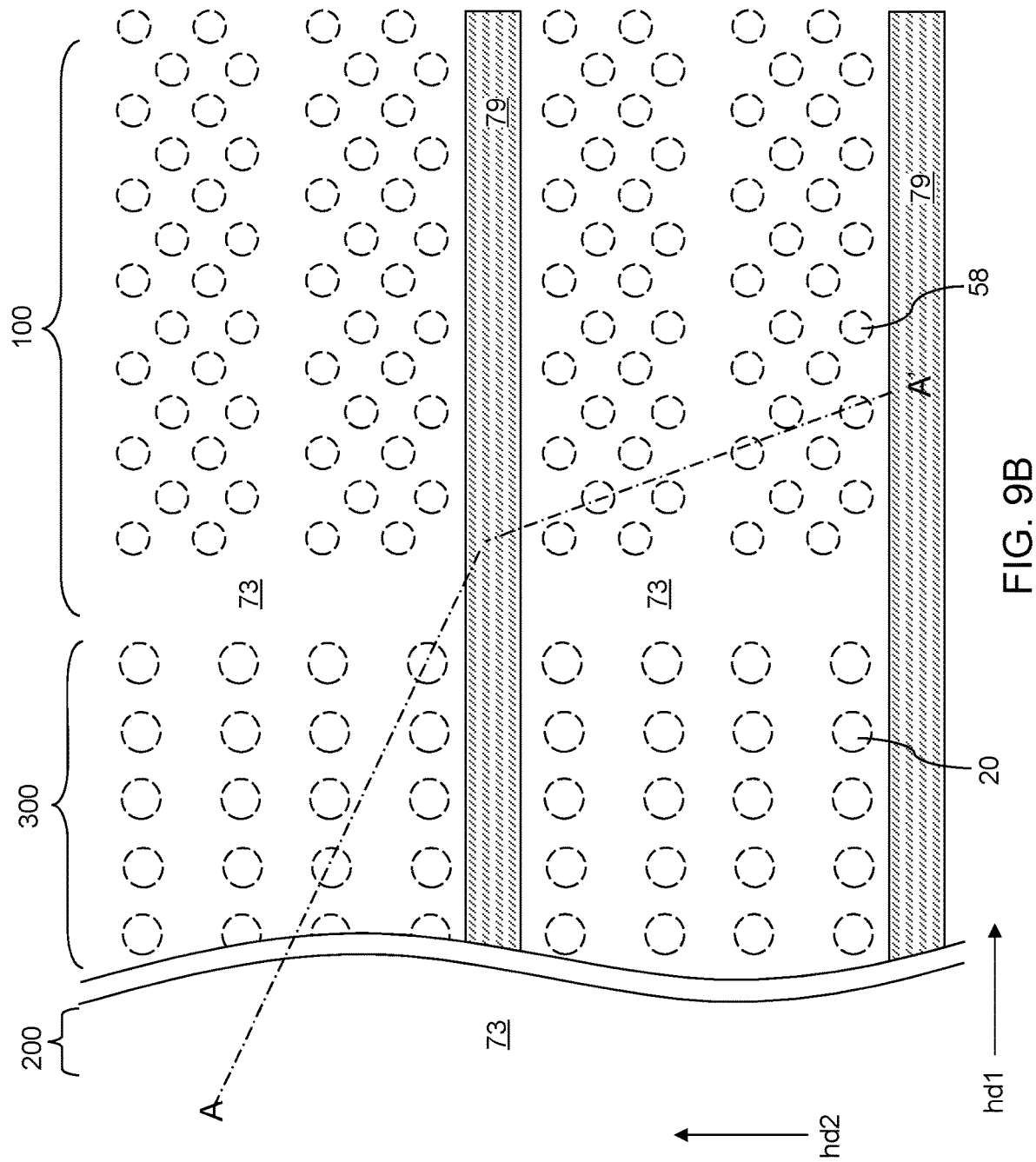
FIG. 9B is a partial see-through top-down view of the exemplary structure of FIG. 9A. The vertical plane A-A' is the plane of the schematic vertical cross-sectional view of FIG. 9A.
Figure 10:
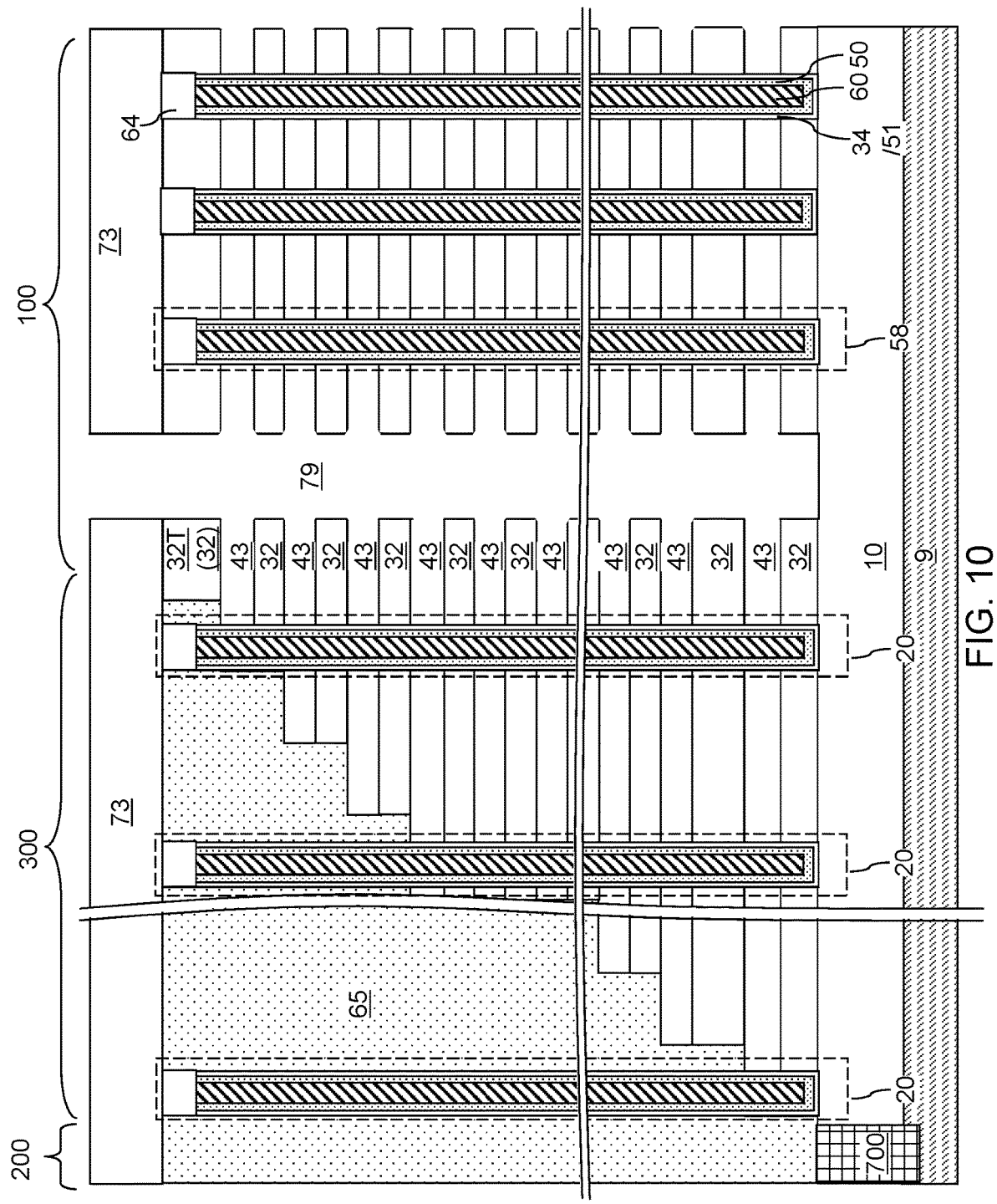
FIG. 10 is a schematic vertical cross-sectional view of the exemplary structure after formation of backside recesses according to an embodiment of the present disclosure.

Referring to FIGS. 9A and 9B, a contact level dielectric layer 73 can be formed over the alternating stack (32, 42) of insulating layer 32 and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory opening fill structures 58. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate 9, and laterally extend through the memory array region 100 and the staircase region 300.

In one embodiment, the backside trenches 79 can laterally extend along a first horizontal direction hd1 (e.g., word line direction) and can be laterally spaced apart among one another along a second horizontal direction hd2 (e.g., horizontal bit line direction) that is perpendicular to the first horizontal direction hd1. The memory opening fill structures 58 can be arranged in rows that extend along the first horizontal direction hd1. Each backside trench 79 can have a uniform width that is invariant along the lengthwise direction (i.e., along the first horizontal direction hd1). Multiple rows of memory opening fill structures 58 can be located between a neighboring pair of a backside trenches 79. The photoresist layer can be removed, for example, by ashing.

Figure 12A:
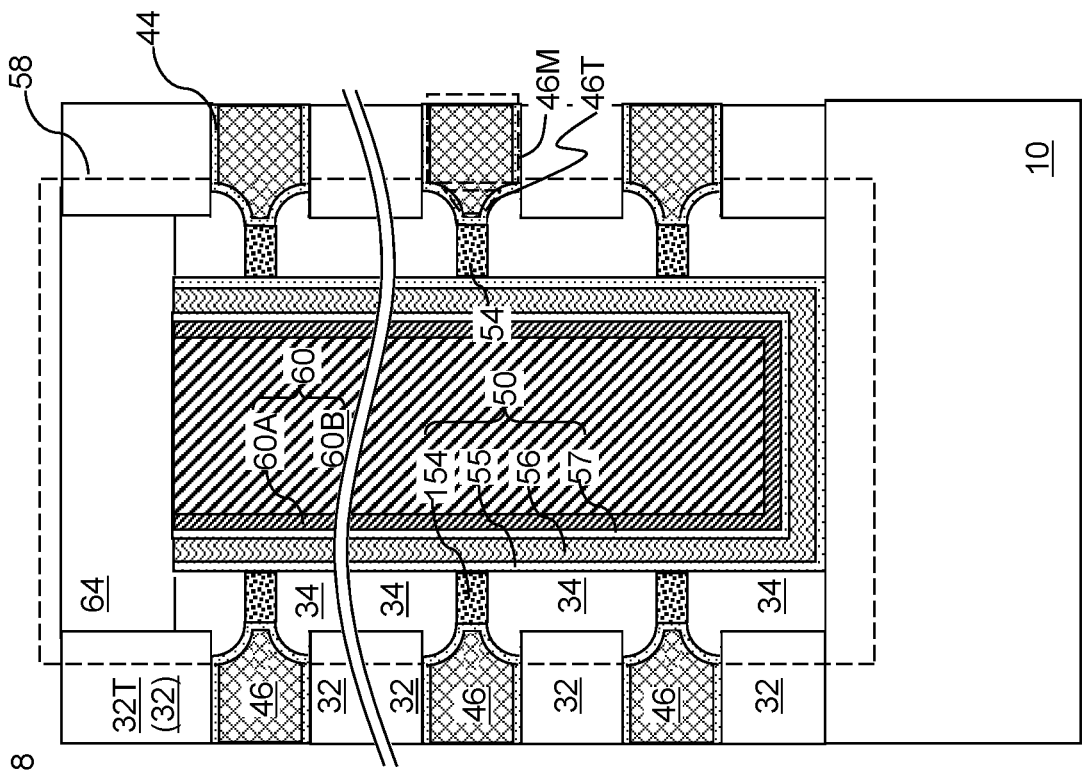
FIGS. 12A and 12B are sequential vertical cross-sectional views of a region around a memory opening fill structure in the second configuration during formation of electrically conductive layers according to an embodiment of the present disclosure.
Figure 13A:
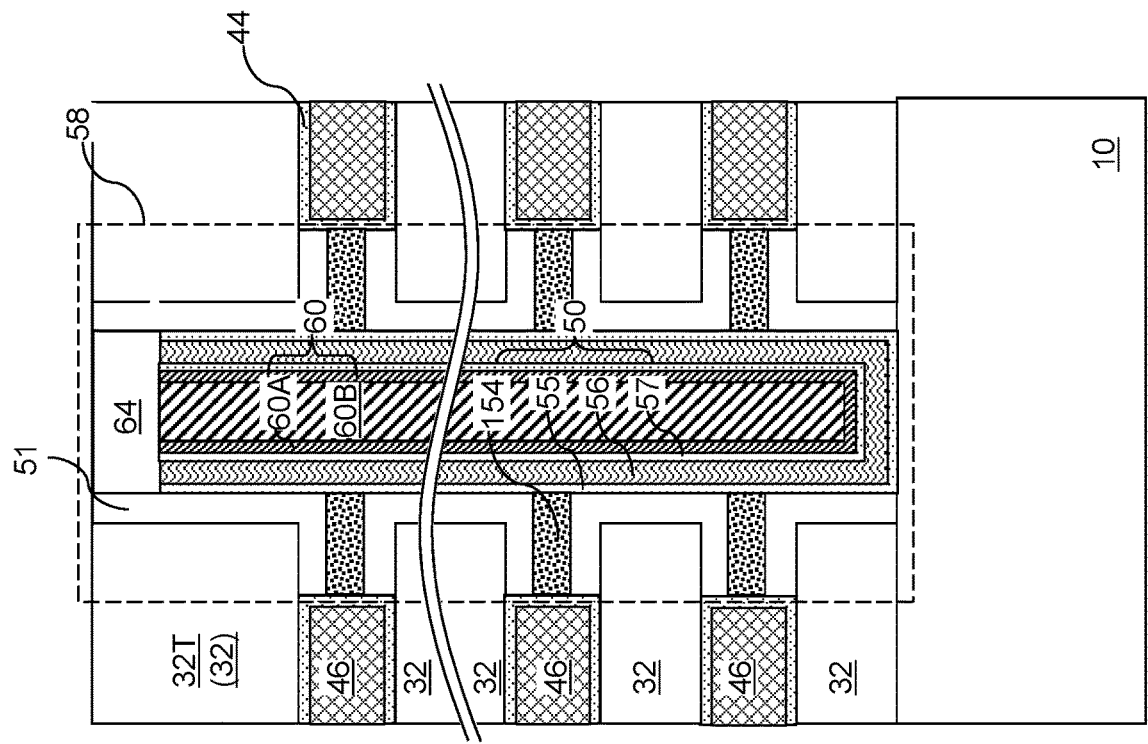
FIGS. 13A and 13B are sequential vertical cross-sectional views of a region around a memory opening fill structure in the third configuration during formation of electrically conductive layers according to an embodiment of the present disclosure.

Referring to FIGS. 10, 11A, 12A, and 13A, an etchant that selectively etches the second material of the sacrificial material layers 42 with respect to the first material of the insulating layers 32 can be introduced into the backside trenches 79, for example, employing an isotropic etch process. FIG. 11A illustrates a region of the exemplary structure in case the exemplary structure is in the first configuration of the first embodiment. FIG. 12A illustrate a region of the exemplary structure in case the exemplary structure is in the second configuration of the second embodiment. FIG. 13A illustrate a region of the exemplary structure in case the exemplary structure is in the third configuration of the third embodiment.

In one embodiment, the sacrificial material layers 42 can include silicon nitride, and the materials of the insulating layers 32 and the retro-stepped dielectric material portion 65 can be selected from silicon oxide and dielectric metal oxides. The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the insulating material layer 10, and the material of the outermost material portions of the memory opening fill structures 58. In case the sacrificial material layers 42 include silicon nitride, a wet etch process employing hot phosphoric acid can be employed to form the backside recesses 43.

For example, if the exemplary structure is in the first configuration, the isotropic etch process employed to form the backside recesses 43 can employ an etch chemistry that is selective to the material of the selector-side spacer layer 57.

If the exemplary structure is in the second configuration, the isotropic etch process employed to form the backside recesses 43 can employ an etch chemistry that is selective to the material of the annular phase change memory material portions 154.

If the exemplary structure is in the third configuration, the isotropic etch process employed to form the backside recesses 43 can employ an etch chemistry that is selective to the material of the memory-side spacer layer 51L. In this case, an additional isotropic etch process such as a wet etch process can be performed to remove physically exposed portions of the memory-side spacer layer 51L. The memory-side spacer layer 51L can be divided into memory-side spacer portions 51 contacting a respective one of the insulating layers 32. A subset of the memory-side spacer portions 51 can have a double-sided flange configuration including an upper annular portion contacting a top surface of an insulating layer 32, a lower annular portion contacting a bottom surface of the insulating layer 32, and a cylindrical tapered-thickness portion that connects the upper annular portion and the lower annular portion and contacts a cylindrical sidewall of the insulating layer 32.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, each backside recess 43 can define a space for receiving a respective word line of a three-dimensional memory device.

Each of the plurality of backside recesses 43 can extend substantially parallel to the top surface of the substrate 9. A backside recess 43 can be vertically bounded by a top surface of an underlying insulating layer 32 and a bottom surface of an overlying insulating layer 32. In one embodiment, each backside recess 43 can have a uniform height throughout.

Referring to FIGS. 11B, 12B, 13B, and 14, a barrier layer 44 can be optionally formed. The barrier layer 44, if present, comprises a conductive material, a semiconducting material, or a dielectric material that limits the electrical current through a neighboring phase change memory material portion. The barrier layer 44 can be formed in the backside recesses 43 and on a sidewall of the backside trench 79. The barrier layer 44 can be formed directly on horizontal surfaces of the insulating layers 32 and sidewalls of the memory opening fill structures 58 within the backside recesses 43. In one embodiment, the barrier layer 44 can be formed by a conformal deposition process such as atomic layer deposition (ALD). The barrier layer 44 can include a material selected from a conductive metallic nitride such as titanium nitride, tungsten or tungsten nitride, a conductive metallic carbide, selenium, tellurium, doped silicon, germanium, an elemental metal such as silver, copper, or aluminum, amorphous carbon or diamondlike carbon (DLC), carbon nitride, an intermetallic alloy or an alloy of at least one metallic element and at least one non-metallic element, an alloy of any of the preceding materials, and/or a layer stack including a plurality of the preceding materials. The thickness of the barrier layer 44 can be in a range from 1 nm to 15 nm, such as 2 to 6 nm, although lesser and greater thicknesses can also be employed.

At least one metallic material can be subsequently deposited in remaining volumes of the backside recesses 43. The at least one metallic material can include a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be subsequently deposited in remaining volumes of the plurality of backside recesses 43, on the sidewalls of the at least one the backside trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory opening fill structures 58 by the metallic barrier layer, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous electrically conductive material layer 46L includes a continuous portion of the metallic barrier layer and a continuous portion of the metallic fill material layer that are located in the backside trenches 79 or above the contact level dielectric layer 73. Each sacrificial material layer 42 can be replaced with an electrically conductive layer 46. A backside cavity 79' is present in the portion of each backside trench 79 that is not filled with the barrier layer 44 and the continuous electrically conductive material layer 46L.

Each of the electrically conductive layers 46 can include a matrix portion 46M having a uniform thickness and located between a vertically neighboring pair of insulating layers 32, a plurality of annular portions 46A having a lesser thickness than the matrix portion 46M and having a respective annular shape that laterally surrounds a respective one of the memory opening fill structures 58, and a plurality of tapered-thickness portions 46T that connects the matrix portion 46M to a respective one of the annular portions 46A and having an upper annular concave surface and a lower annular concave surface as illustrated in FIG. 11B. Each tapered-thickness portion 46T has an annular shape and has a thickness that increases with a lateral distance from a vertical axis passing through a geometrical center of a respective memory opening fill structure 58. The configuration of FIG. 11B makes the distance "D" between adjacent phase change memory material portions near adjacent word lines 46 longer, which lessens a thermal disturb effect between phase change memory material portions.

Figure 12B:
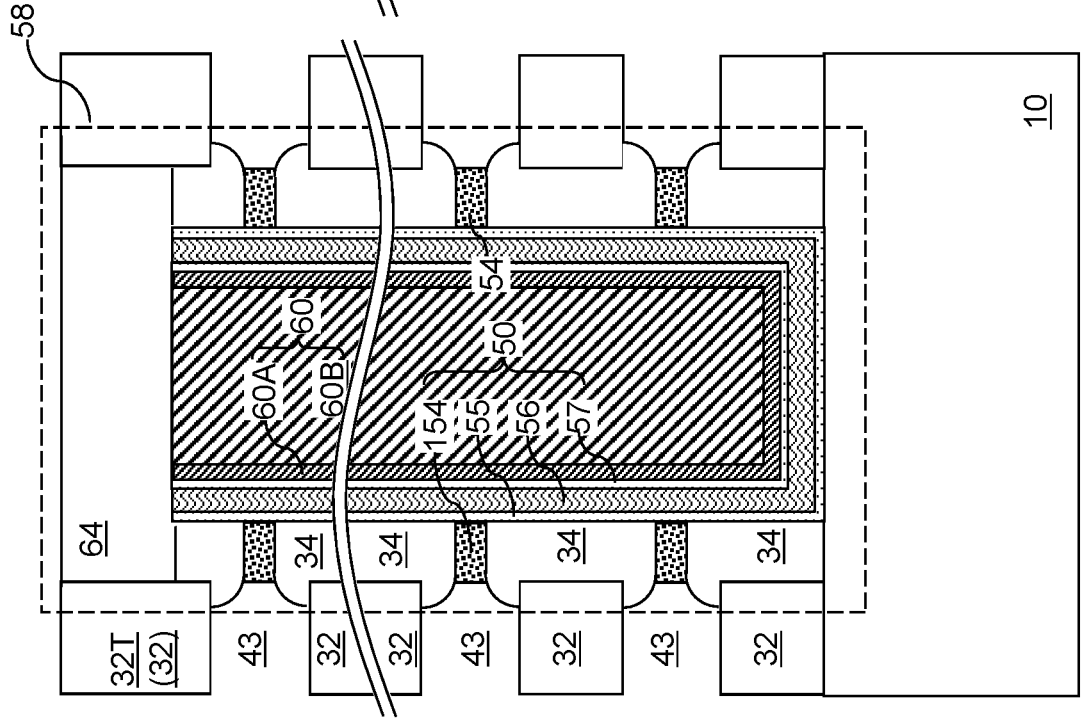

Alternatively, each of the electrically conductive layers 46 can include a matrix portion 46M having a uniform thickness and located between a vertically neighboring pair of insulating layers 32, and a plurality of tapered-thickness portions 46T that are connected to the matrix portion 46M and include a respective upper annular concave surface and a respective lower annular concave surface as illustrated in FIG. 12B. Each tapered-thickness portion 46T has an annular shape and has a thickness that increases with a lateral distance from a vertical axis passing through a geometrical center of a respective memory opening fill structure 58.

Figure 13B:
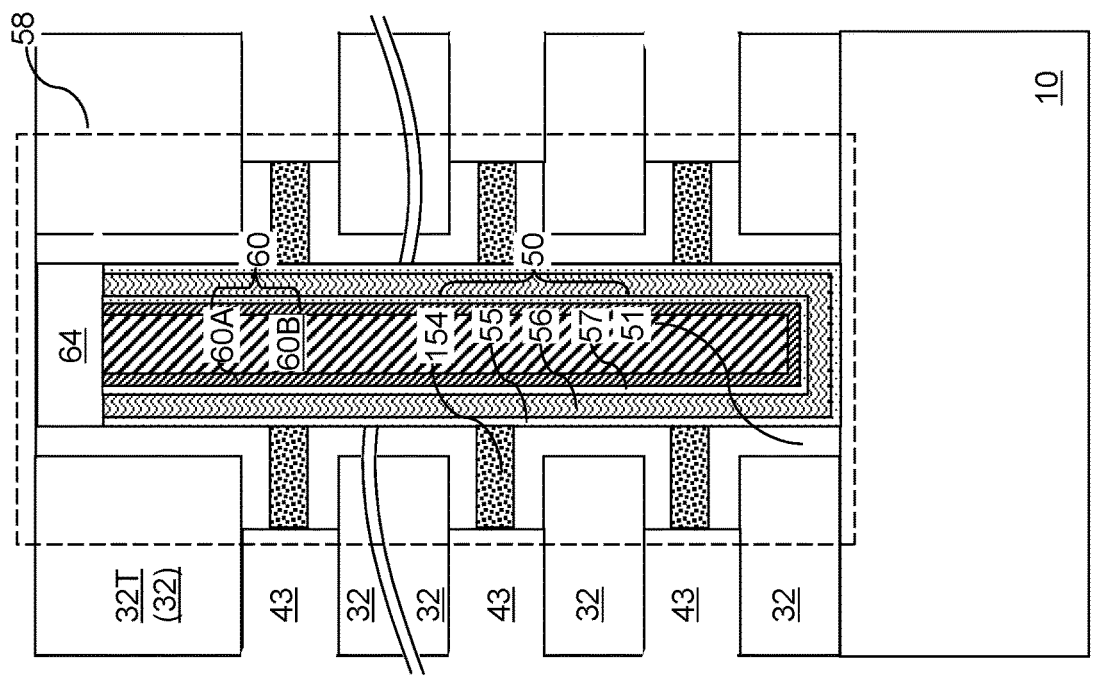
Figure 14:
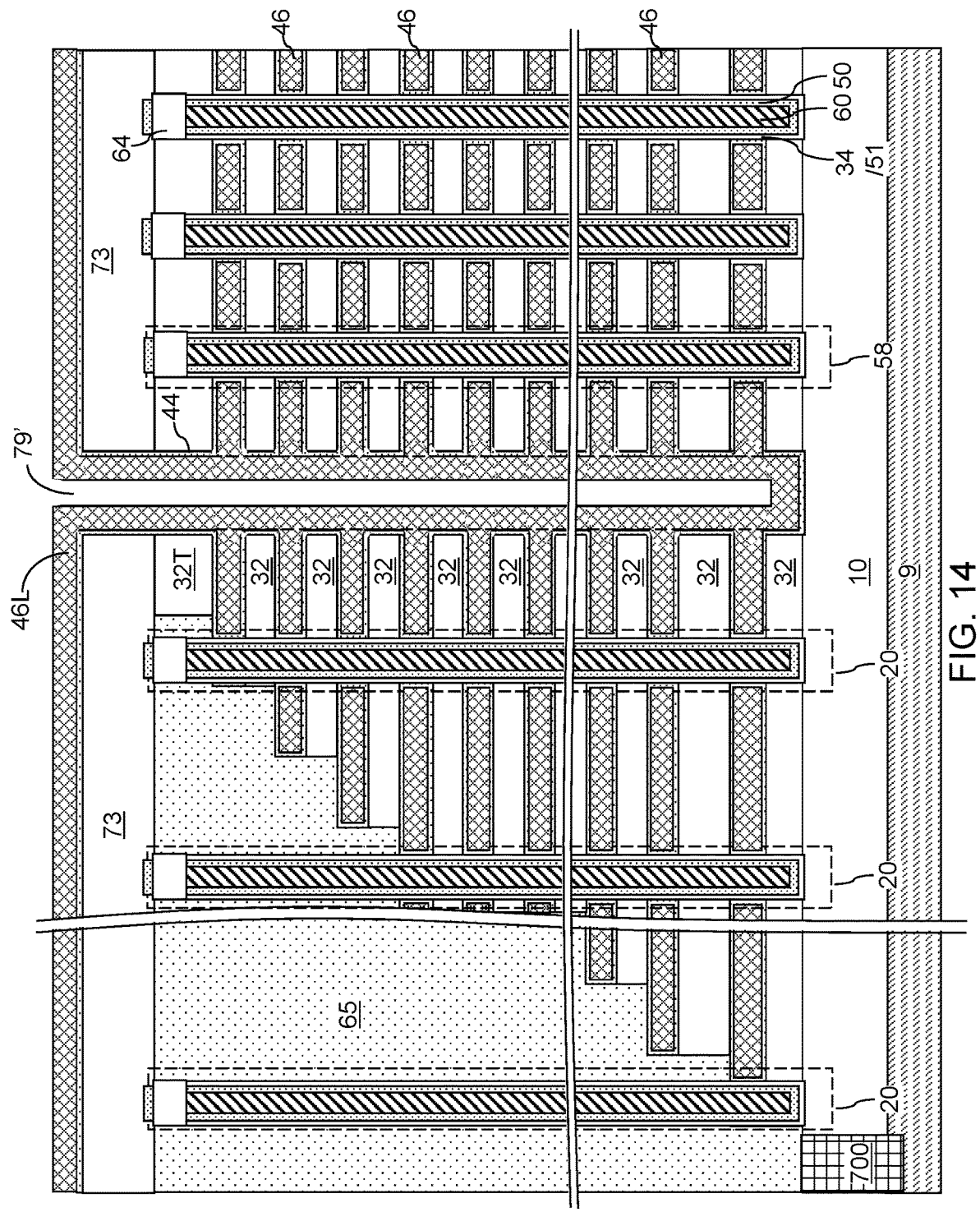
FIG. 14 is a schematic vertical cross-sectional view of the exemplary structure at the processing step of FIG. 11B, 12B, or 13B.

Yet alternatively, each of the electrically conductive layers 46 can have a uniform thickness throughout as illustrated in FIG. 13B.

Figure 15A:
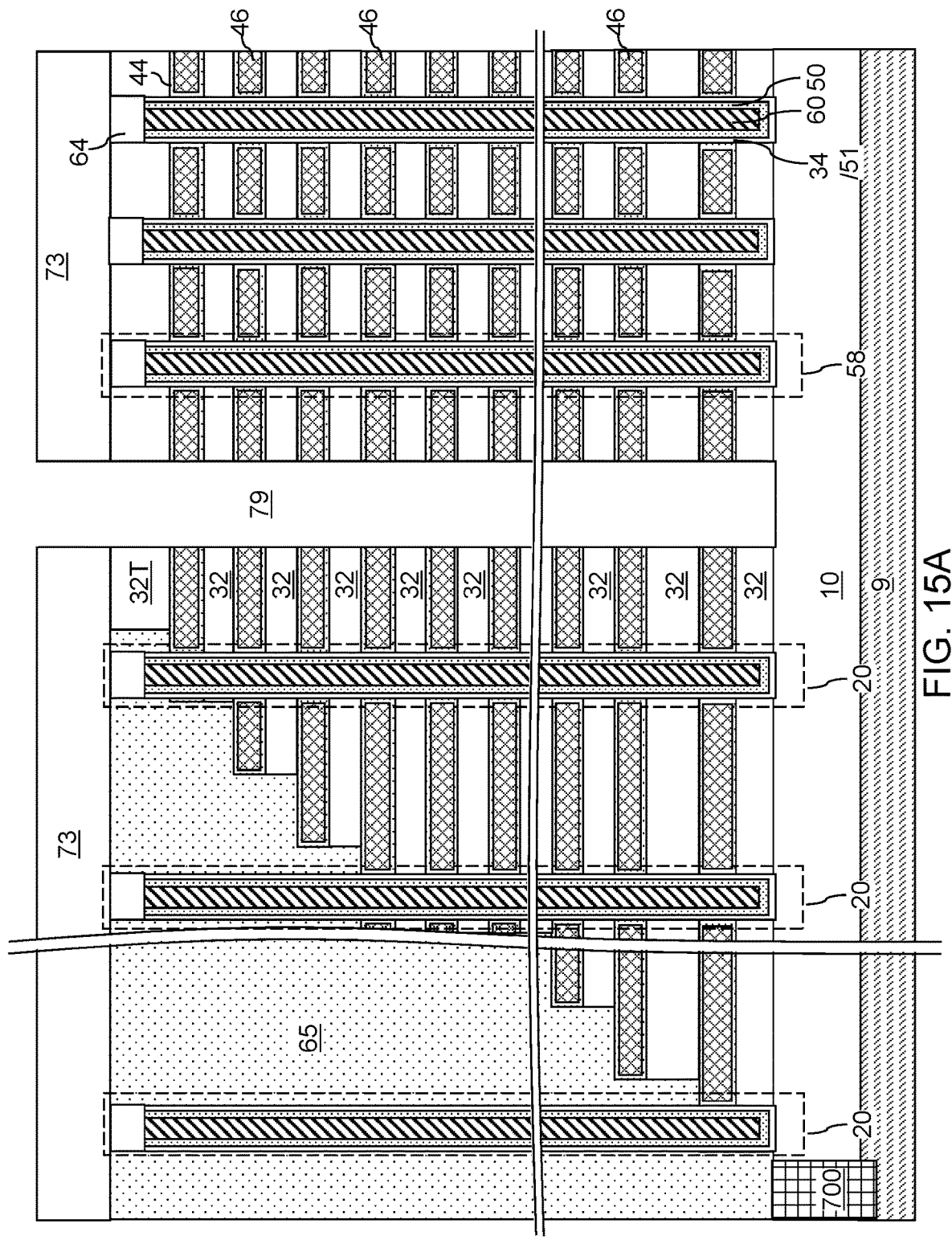
FIG. 15A is a schematic vertical cross-sectional view of the exemplary structure after removal of a deposited conductive material from within the backside trench according to an embodiment of the present disclosure.
Figure 15B:
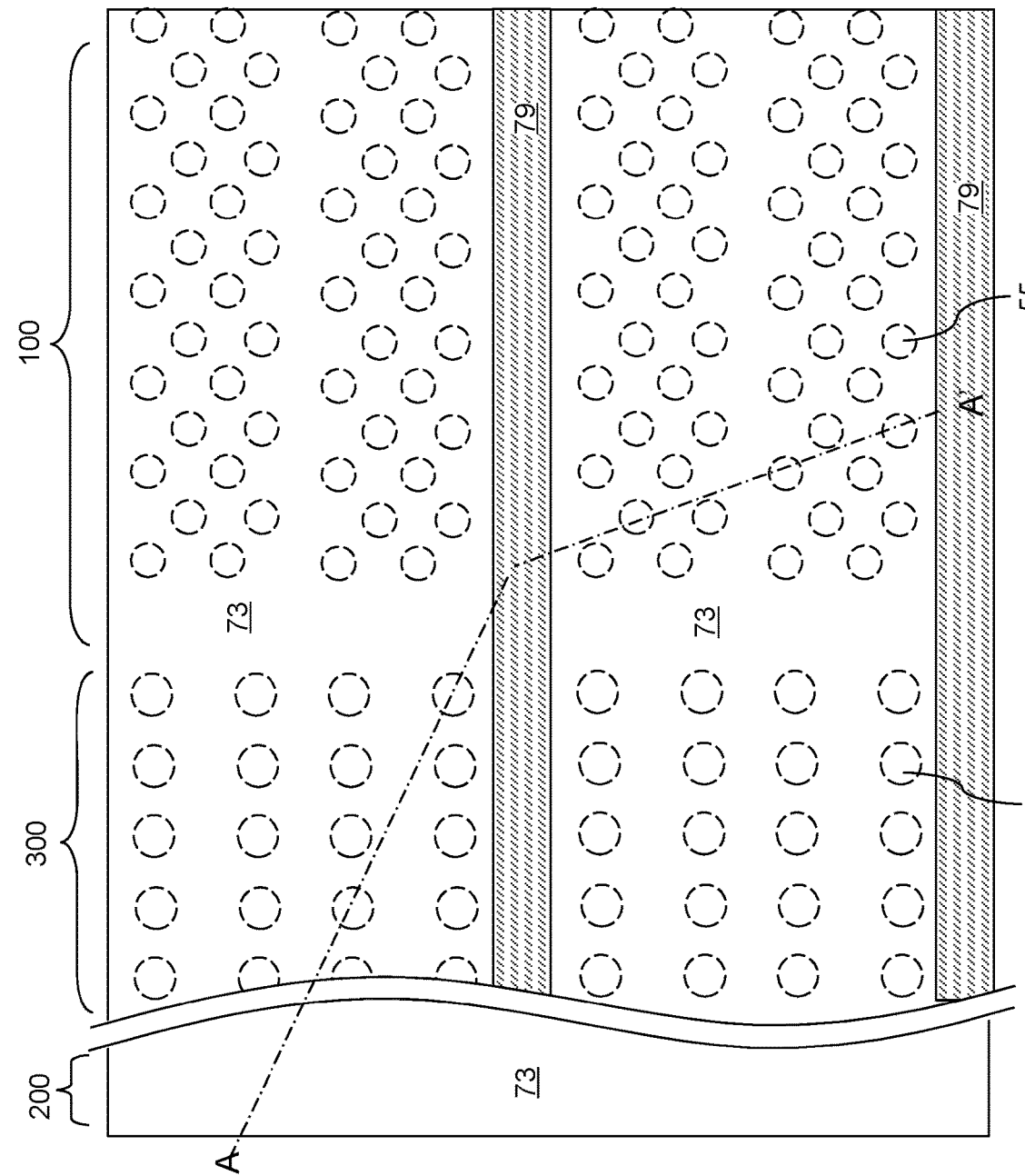
FIG. 15B is a partial see-through top-down view of the exemplary structure of FIG. 15A. The vertical plane A-A' is the plane of the schematic vertical cross-sectional view of FIG. 15A.

Referring to FIGS. 15A and 15B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a word line. In other words, each electrically conductive layer 46 can be a word line that functions as a common electrode for the plurality of vertical memory devices.

In one embodiment, the removal of the continuous electrically conductive material layer 46L can be selective to the material of the barrier layer 44. In this case, a horizontal portion of the barrier layer 44 can be present at the bottom of each backside trench 79. In another embodiment, the removal of the continuous electrically conductive material layer 46L may not be selective to the material of the barrier layer 44 or, the barrier layer 44 may not be employed. A backside cavity 79' is present within each backside trench 79.

Figure 16:
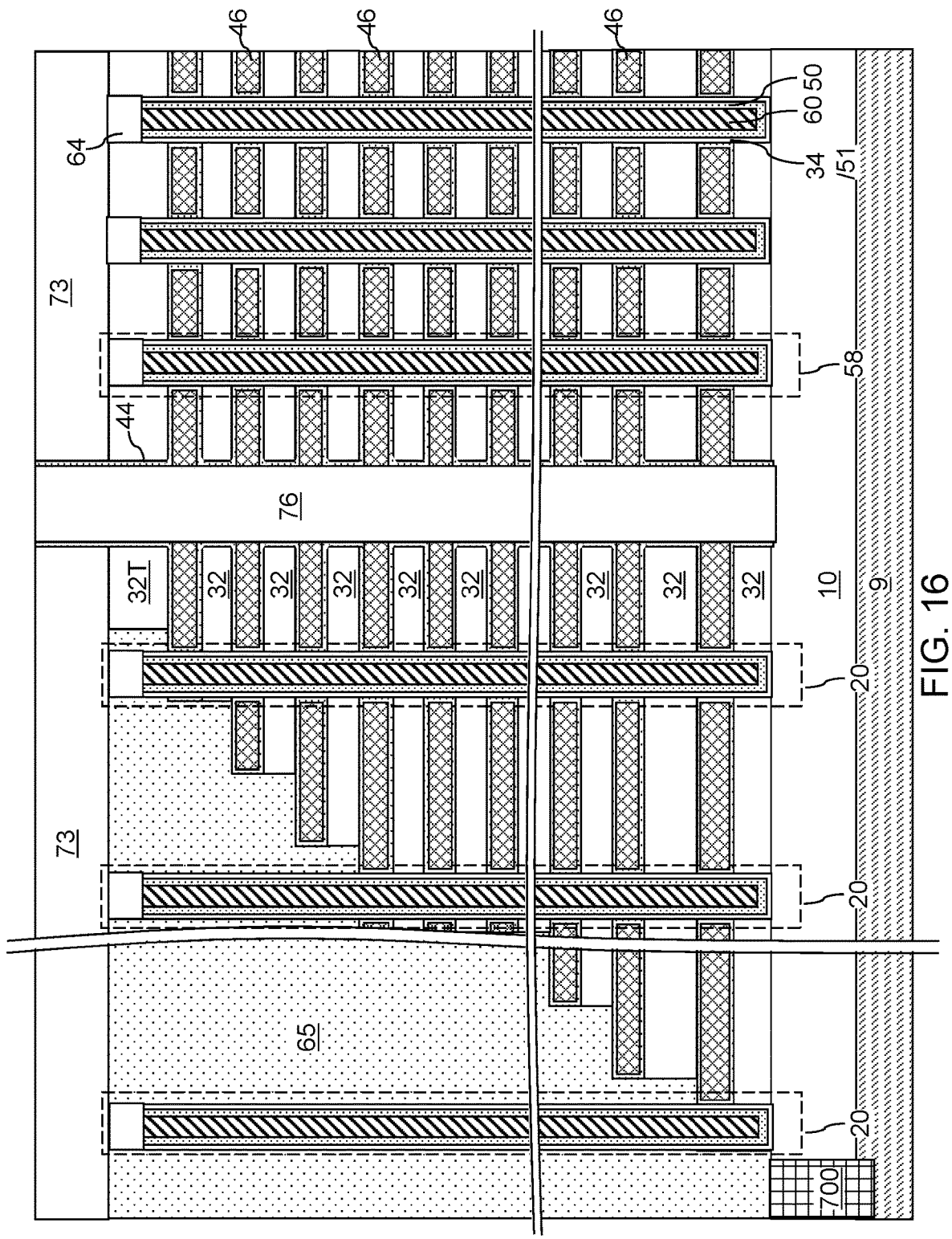
FIG. 16 is a schematic vertical cross-sectional view of the exemplary structure after formation of backside trench fill structures according to an embodiment of the present disclosure.

Referring to FIG. 16, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). Excess portions of the insulating material layer may be removed from above the contact level dielectric layer 73 by a planarization process such as a recess etch process. Each remaining portion of the insulating material layer in the backside trenches 79 constitutes a dielectric backside trench fill structure 76.

Figure 17A:
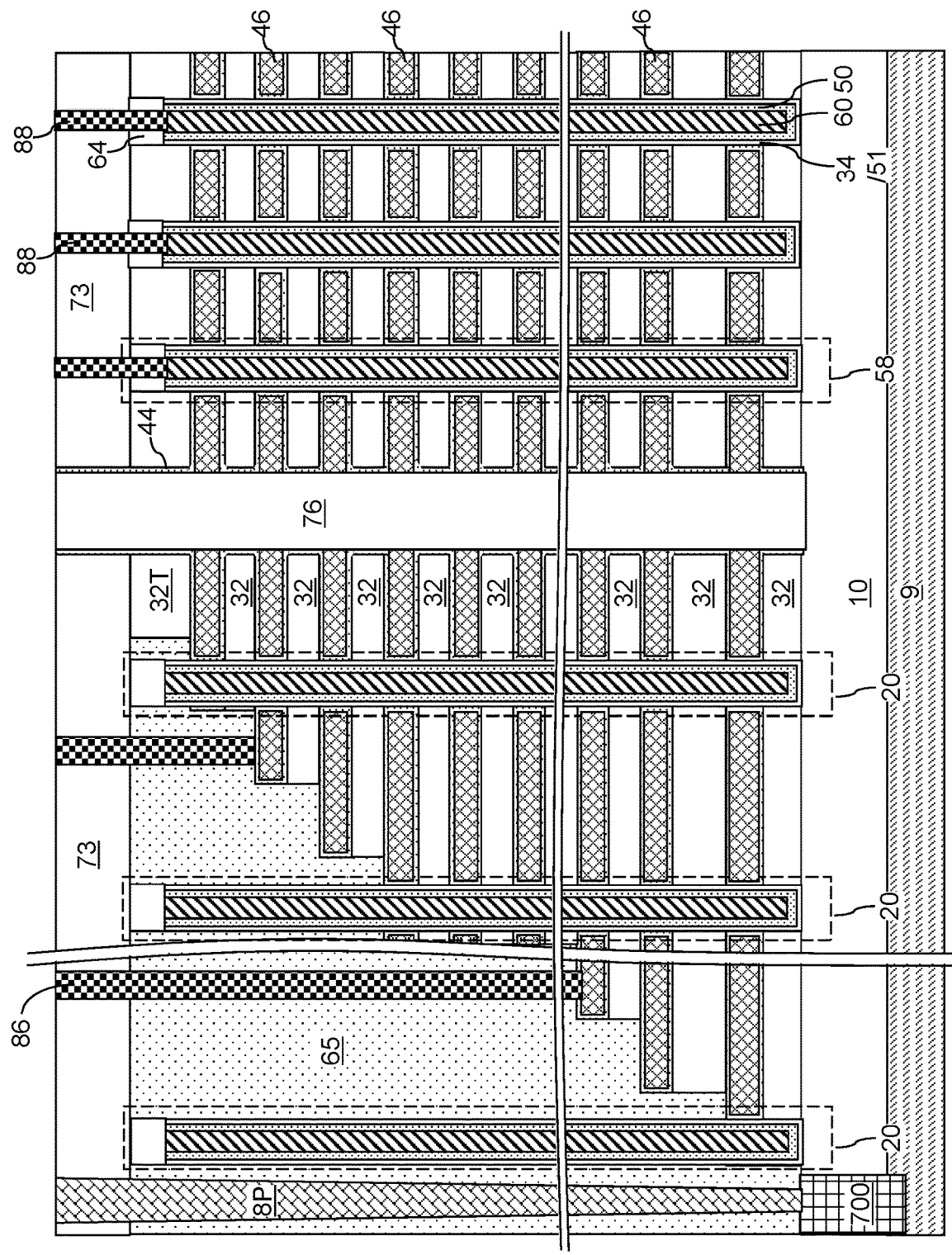
FIG. 17A is a schematic vertical cross-sectional view of the exemplary structure after formation of contact via structures according to an embodiment of the present disclosure.
Figure 17B:
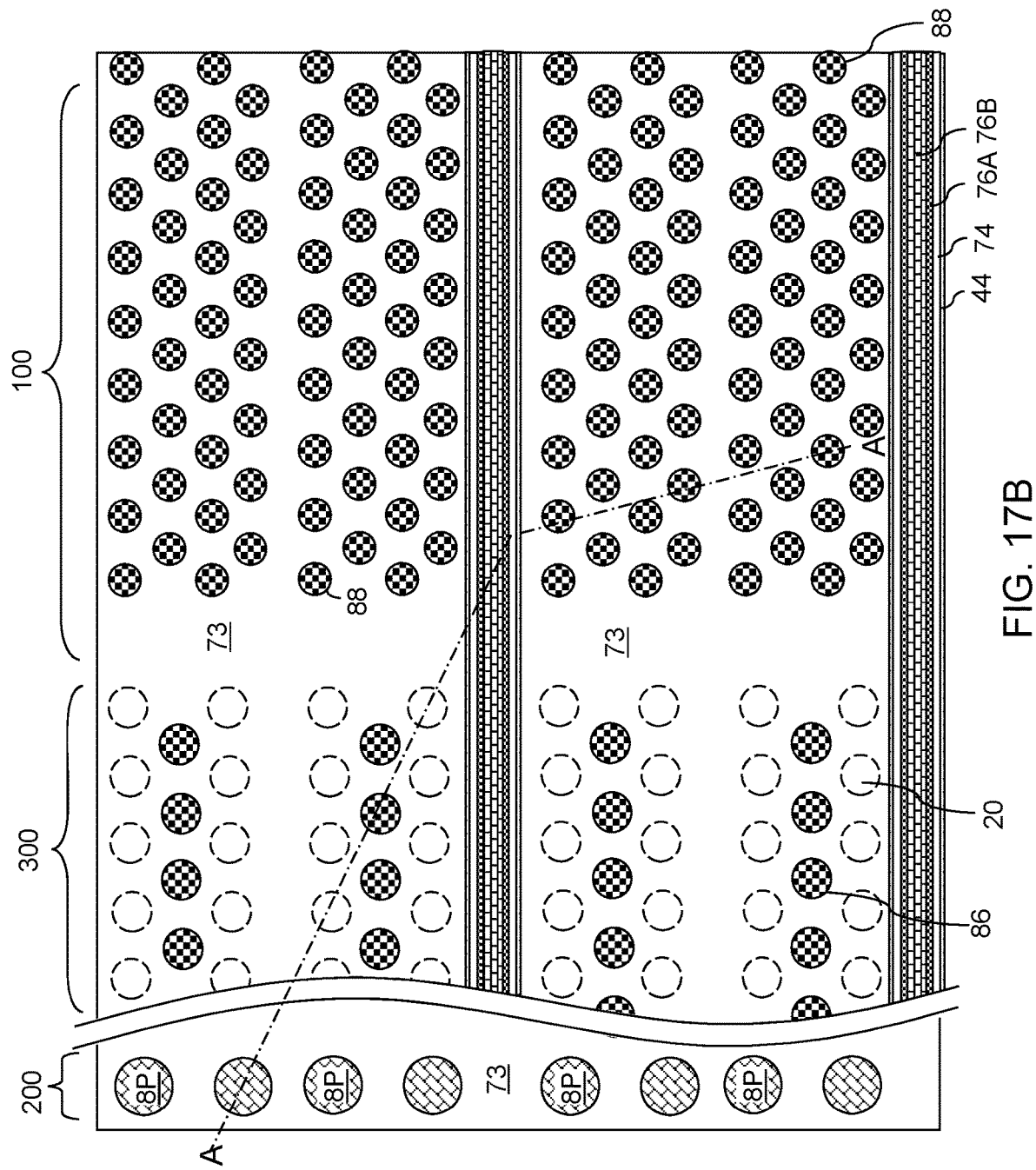
FIG. 17B is a top-down view of the exemplary structure of FIG. 17A. The vertical plane A-A' is the plane of the schematic vertical cross-sectional view of FIG. 17A.

Referring to FIGS. 17A and 17B, contact via structures (88, 86, 8P) can be formed through the contact level dielectric layer 73, and optionally through the retro-stepped dielectric material portion 65. For example, horizontal bit lines (or bit line contact via structures that are connected to horizontal bit lines) 88 can be formed through the contact level dielectric layer 73 on each vertical bit line 60. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

FIGS. 18A-18D illustrate steps in a method of making a memory device according to a fourth embodiment of the present disclosure. The in-process structure of FIG. 18A may be derived from the structure shown in FIG. 5B. However, in the structure of the fourth embodiment shown in FIG. 18A each sacrificial material layer includes three sublayers: a top sublayer 42T, a bottom sublayer 42B located below the top sublayer, and a middle sublayer 42M located between the top and bottom sublayers. The top and bottom sublayers (42T, 42B) comprise a different material from the middle sublayer 42M that may be selectively etched with respect to the middle sublayer. In one embodiment, the top and bottom sublayers (42T, 42B) comprise silicon, such as amorphous silicon or polysilicon, and the middle sublayer 42M comprises silicon nitride. Other suitable materials may also be used. Thus, the alternating stack includes three different materials: the insulating layer 32 material (e.g., silicon oxide), the top and bottom sublayer (42T, 42B) material (e.g., silicon) and middle sublayer 42M material (e.g., silicon nitride).

As shown in FIG. 18B, the top and bottom sublayers (42T, 42B) are recessed by a selective isotropic etch which etches the top and bottom sublayers (42T, 42B) selective to the middle sublayer 42M and the insulating layers 32. This forms the protruding tip portions 42P that comprise the middle sublayer 42M portions that extend into the memory opening 49 past the insulating layers 32. The structure shown in FIG. 18B is similar to the structure shown in FIG. 5C.

Figure 18D:
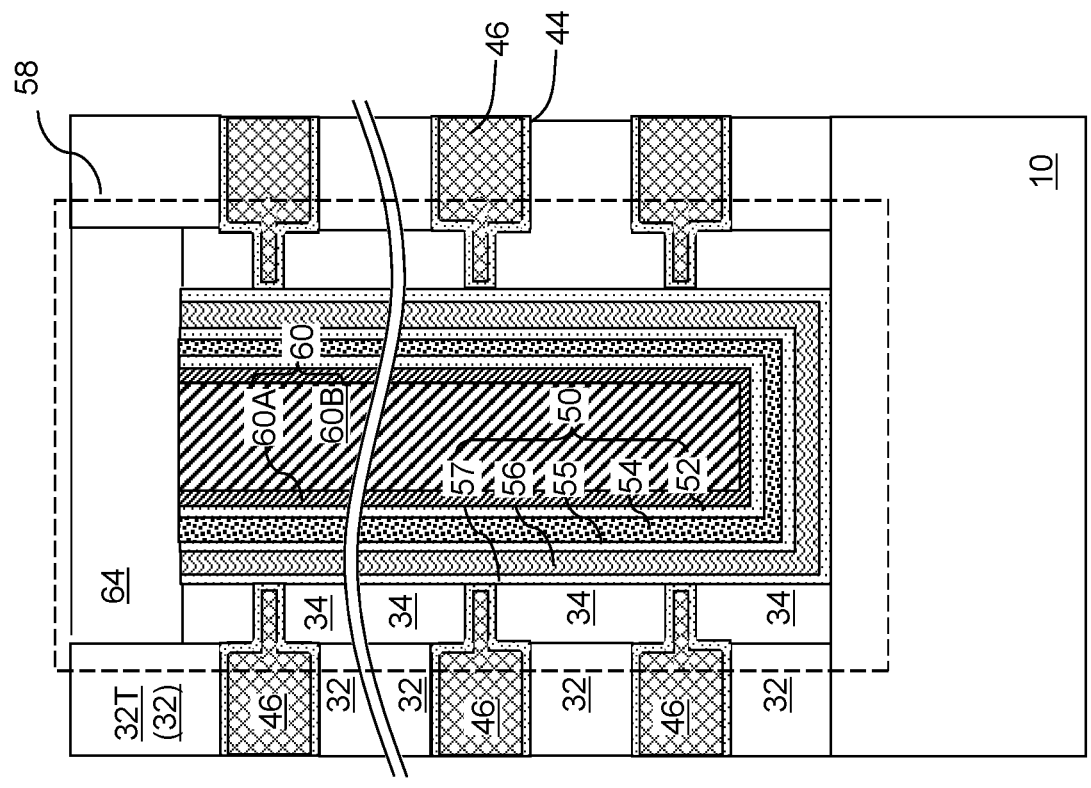
Figure 18C:
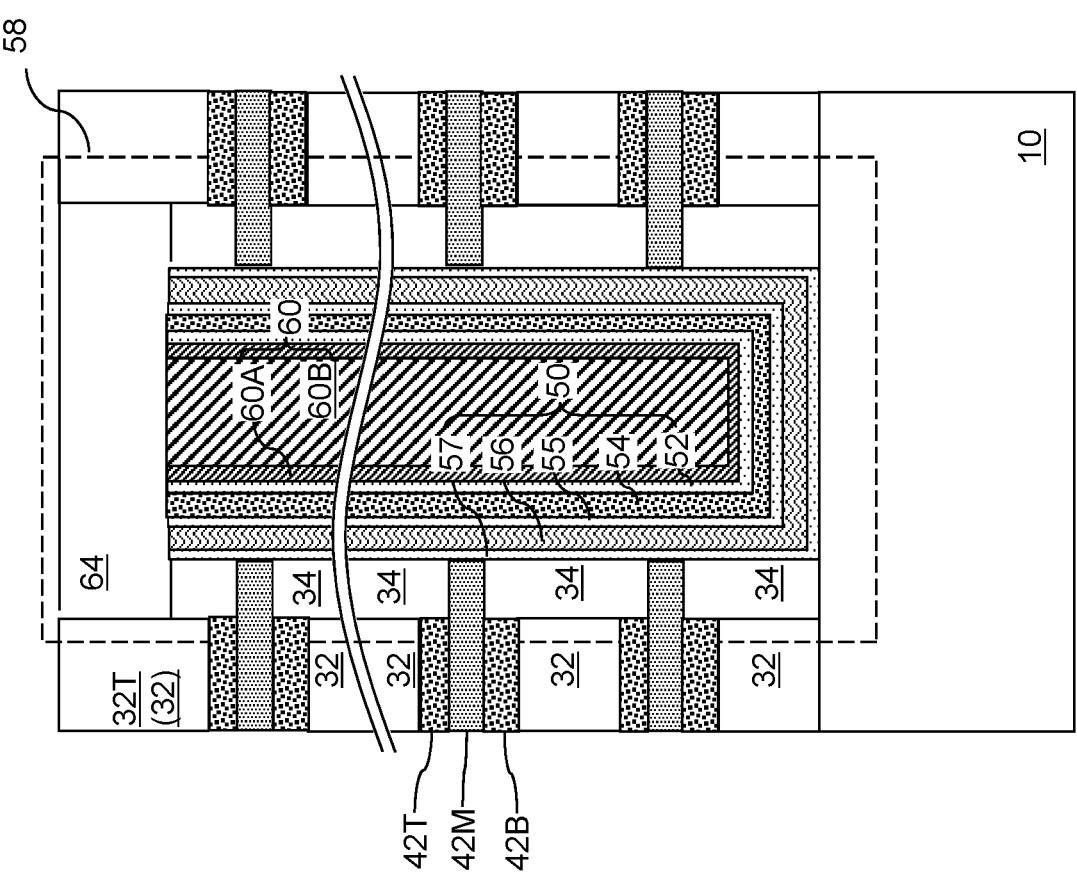

The steps shown in FIGS. 5D to 5G are then performed as described above to form the structure shown in FIG. 18C. The structure shown in FIG. 18C is similar to the structure shown in FIG. 5G.

The steps shown in FIGS. 8 to 11B are then performed as described above to form the structure shown in FIG. 18D. The structure shown in FIG. 18D is similar to the structure shown in FIG. 11B. The memory device of the fourth embodiment is then completed by performing the steps shown in FIGS. 14 to 17B described above.

Referring FIGS. 12B and 13B according to the second and third embodiments of the present disclosure, a three-dimensional memory device comprises an alternating stack of insulating layers 32 and electrically conductive layers 46 located over a substrate 9; and memory openings 49 extending through the alternating stack (32, 46) and filled within a respective memory opening fill structure 58, wherein: each memory opening fill structure 58 comprises a vertical bit line 60 and a vertical stack of discrete phase change memory material portions 154; and each of the discrete phase change memory material portions 154 in the vertical stack is located between a respective vertically neighboring pair of the insulating layers 32 within the alternating stack (32, 46) and has a vertical thickness that is less than a vertical thickness of a respective electrically conductive layer 46 located between the respective vertically neighboring pair of the insulating layers 32 within the alternating stack (32, 46) as illustrated in FIGS. 12B and 13B. Each of the discrete phase change memory material potions comprises a respective annular phase change memory material portion 154.

In some embodiments, each memory opening fill structure 58 comprises a vertical stack of insulating spacers 34; and a plurality of insulating spacers 34 within the vertical stack of insulating spacers 34 contacts a sidewall, a portion of a top surface, and a portion of a bottom surface, of a respective one of the insulating layers 32 within the alternating stack (32, 46) as illustrated in FIG. 12B.

In one embodiment, each insulating spacer 34 within the plurality of insulating spacers 34 contacts a bottom surface of an overlying one of discrete phase change memory material portions 154 and contacts a top surface of an underlying one of the discrete phase change memory material portions 154. In one embodiment, each interface between the plurality of insulating spacers 34 and the discrete phase change memory material portions 154 is an annular interface located within a respective horizontal plane.

In one embodiment, each insulating spacer 34 within the plurality of insulating spacers 34 comprises: an upper annular convex surface having a bottom periphery that contacts the top surface of the respective one of the insulating layers 32 within the alternating stack (32, 46); and a lower annular convex surface having a top periphery that contacts the bottom surface of the respective one of the insulating layers 32 within the alternating stack (32, 46) as illustrated in FIG. 12B.

In one embodiment, an insulating spacer 34 of the plurality of insulating spacers 34 comprises: an annular top surface having an inner periphery that is adjoined to an upper periphery of a vertical cylindrical sidewall of the insulating spacer 34; and an annular bottom surface having an inner periphery that is adjoined to a lower periphery of the vertical cylindrical sidewall of the insulating spacer 34.

In on embodiment, each memory opening fill structure 58 comprises a selector material layer 56 located between the vertical bit line 60 and the vertical stack of discrete phase change memory material portions 154.

In one embodiment, each of the electrically conductive layers 46 within the alternating stack (32, 46) comprises a word line containing a matrix portion 46M located between neighboring pairs of memory openings 49 and a plurality of tapered-thickness portions 46T that protrude toward, and laterally surround, a respective one of the memory openings 49 and having a variable vertical thickness that is not greater than the thickness of the matrix portion 46M, as illustrated in FIG. 12B.

Referring to FIGS. 11B, 12B and 18D and according to the first, second and fourth embodiments of the present disclosure, a three-dimensional memory device comprises: an alternating stack of insulating layers 32 and electrically conductive layers 46 located over a substrate 9; and memory openings 49 extending through the alternating stack (32, 46) and filled within a respective memory opening fill structure 58, wherein: each memory opening fill structure 58 comprises a vertical bit line 60 and a phase change memory material (54, 154) laterally surrounding the vertical bit line 60; and each of the electrically conductive layers 46 within the alternating stack (32, 46) comprises a word line containing a matrix portion 46M located between neighboring pairs of memory openings 49 and a plurality of protruding portions (46A, 46T) that protrude toward, and laterally surround, a respective one of the memory openings 49, as illustrated in FIGS. 11B, 12B. The phase change memory material (54, 154) may comprise portions of a phase change memory material layer 54 that are proximal to inner sidewalls of annular portions 46A of the electrically conductive layers 46 as illustrated in FIG. 11B or 18D, or may comprise the annular phase change memory material portions 154 as illustrated in FIG. 12B.

In one embodiment, each memory opening fill structure 58 comprises a selector material layer 56 laterally surrounding the vertical bit line 60 and laterally surrounded by each of the electrically conductive material layers 46 within the alternating stack (32, 46). In one embodiment, each of the vertical bit line 60 and the selector material layer 56 continuously extends vertically through each electrically conductive layer 46 within the alternating stack (32, 46).

In one embodiment, each memory opening fill structure 58 comprises a vertical stack of insulating spacers 34; and a plurality of insulating spacers 34 within the vertical stack of insulating spacers 34 contacts a sidewall, a portion of a top surface, and a portion of a bottom surface, of a respective one of the insulating layers 32 within the alternating stack (32, 46).

In one embodiment, each insulating spacer 34 within the plurality of insulating spacers 34 comprises: an upper annular convex surface having a bottom periphery that contacts the top surface of the respective one of the insulating layers 32 within the alternating stack (32, 46); and a lower annular convex surface having a top periphery that contacts the bottom surface of the respective one of the insulating layers 32 within the alternating stack (32, 46).

In one embodiment, the protruding portions (46A, 46T) comprise a plurality of tapered-thickness portions 46T that protrude toward, and laterally surround, a respective one of the memory openings 49 and having a variable vertical thickness; and each of the tapered-thickness portions 46T comprises an upper concave annular surface and a lower concave annular surface, as shown in FIGS. 11B and 12B.

In another embodiment, the protruding portions (46A, 46T) comprise a plurality of annular portions 46A that protrude toward, and laterally surround, a respective one of the memory openings 49 and having a vertical thickness that is thinner than a vertical thickness of the matrix portion 46M.

The vertical extent of each region in which an outer surface of a phase change memory material potion has an areal overlap (as measured on a vertical plane) with a most proximal sidewall surface of the electrically conductive layers 46 is less than the maximum height of the respective electrically conductive layer 46 (such as the thickness of the matrix portion 46M of the respective electrically conductive layer 46). By reducing the overlap area between neighboring pairs of a phase change memory material potion and an electrically conductive layer (i.e., word line) 46, the reset current density in a phase change memory material is increased. This causes more intense Joule heating and more rapidly elevates temperature of a phase change memory material near the overlap area with an electrically conductive layer 46. The transition from a low resistive crystalline phase to a high resistive amorphous phase occurs faster due the thermal energy, and enables the device operation quicker. The local current density increase only in the phase change memory material may also reduce the supply voltage for the memory device chip. This reduces the device power consumption and reduces the required size of the driver transistor(s). Furthermore, this also makes the distance between phase change memory material portions near adjacent word lines longer, which lessens the thermal disturb effect between phase change memory material portions.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate; and
   memory openings extending through the alternating stack and filled within a respective memory opening fill structure,
   wherein:
   each memory opening fill structure comprises a vertical bit line and a vertical stack of discrete phase change memory material portions;
   each of the discrete phase change memory material portions in the vertical stack is located between a respective vertically neighboring pair of the insulating layers within the alternating stack and has a vertical thickness that is less than a vertical thickness of a respective electrically conductive layer located between the respective vertically neighboring pair of the insulating layers within the alternating stack; and
   each memory opening fill structure comprises a vertical stack of spacers; and
   a plurality of spacers within the vertical stack of spacers contacts a sidewall, a portion of a top surface, and a portion of a bottom surface, of a respective one of the insulating layers within the alternating stack.

2. The three-dimensional memory device of claim 1, wherein each spacer within the plurality of spacers contacts a bottom surface of an overlying one of the discrete phase change memory material portions and contacts a top surface of an underlying one of the discrete phase change memory material portions.

3. The three-dimensional memory device of claim 2, wherein each interface between the plurality of spacers and the discrete phase change memory material portions is an annular interface located within a respective horizontal plane.

4. The three-dimensional memory device of claim 1, wherein each spacer within the plurality of spacers comprises:
   an upper annular convex surface having a bottom periphery that contacts the top surface of the respective one of the insulating layers within the alternating stack; and
   a lower annular convex surface having a top periphery that contacts the bottom surface of the respective one of the insulating layers within the alternating stack.

5. The three-dimensional memory device of claim 1, wherein a spacer among the plurality of spacers comprises:
   an annular top surface having an inner periphery that is adjoined to an upper periphery of a vertical cylindrical sidewall of the spacer; and
   an annular bottom surface having an inner periphery that is adjoined to a lower periphery of the vertical cylindrical sidewall of the spacer.

\* \* \* \* \*